US012660483B2

(12) United States Patent
Lou

(10) Patent No.: US 12,660,483 B2
(45) Date of Patent: *Jun. 16, 2026

(54) DISPLAY PANEL AND DISPLAY DEVICE

(71) Applicant: Shanghai Tianma Micro-Electronics Co., Ltd., Shanghai (CN)

(72) Inventor: Yanbo Lou, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 754 days.

This patent is subject to a terminal disclaimer.

(21) Appl. No.: 18/062,184

(22) Filed: Dec. 6, 2022

(65) Prior Publication Data

US 2023/0096638 A1 Mar. 30, 2023

(30) Foreign Application Priority Data

Jul. 12, 2022 (CN) .......................... 202210821042.6

(51) Int. Cl.
H10K 59/80 (2023.01)
H10D 86/40 (2025.01)
(Continued)

(52) U.S. Cl.
CPC ....... H10K 59/8792 (2023.02); H10D 86/441 (2025.01); H10D 86/60 (2025.01);
(Continued)

(58) Field of Classification Search
CPC ............. H10K 59/8792; H10K 59/131; H10K 59/122; H10K 59/879; H10K 59/1213; H10K 59/38; H10D 86/441; H10D 86/60
(Continued)

(56) References Cited

U.S. PATENT DOCUMENTS

2019/0280174 A1* 9/2019 Okahisa ................ F21S 41/285

FOREIGN PATENT DOCUMENTS

CN 114333609 A 4/2022

OTHER PUBLICATIONS

Espacenet Patent Search Complete (Global Dossier) (Year: 2026).*
(Continued)

*Primary Examiner* — James R Greece
*Assistant Examiner* — Hana S Featherly
(74) *Attorney, Agent, or Firm* — CHRISTENSEN O'CONNOR JOHNSON KINDNESS PLLC

(57) ABSTRACT

A display panel including a substrate, a light-emitting element layer, and a light-shielding layer. The light-shielding layer is arranged at a side of the light-emitting element layer facing away from the substrate. In the light-emitting element layer, an auxiliary light-emitting element is arranged at a periphery of the primary light-emitting element. The light-shielding layer includes a first opening corresponding to the primary light-emitting element and a light-shielding part covering the auxiliary light-emitting element. When both the primary light-emitting element and the auxiliary light-emitting element emit light, the viewer at a large viewing angle sees light emitted by the primary light-emitting element and interfering light emitted by the auxiliary light-emitting element; and when the primary light-emitting element emits light and the auxiliary light-emitting element does not emit light, the viewer only sees the light emitted by the primary light-emitting element.

34 Claims, 26 Drawing Sheets

(51) Int. Cl.
   *H10D 86/60*      (2025.01)
   *H10K 59/121*     (2023.01)
   *H10K 59/122*     (2023.01)
   *H10K 59/131*     (2023.01)
   *H10K 59/38*      (2023.01)

(52) U.S. Cl.
   CPC ....... *H10K 59/1213* (2023.02); *H10K 59/122*
         (2023.02); *H10K 59/131* (2023.02); *H10K*
         *59/38* (2023.02); *H10K 59/879* (2023.02)

(58) Field of Classification Search
   USPC ........................................................ 313/509
   See application file for complete search history.

(56)              References Cited

OTHER PUBLICATIONS

Office Action mailed May 31, 2024, issued in corresponding Chinese Application No. 202210821042.6 filed Jul. 12, 2022; 11 pages.

* cited by examiner

001

001

001

001

52    32    31/51

03/05

02

22    21    01

001

52    32    31/51

03/05

02

22    21    01

001

001

001

001

001

001

001

~001

DISPLAY PANEL AND DISPLAY DEVICE

CROSS-REFERENCE TO RELATED APPLICATIONS

The present application claims priority to Chinese Patent Application No. 202210821042.6, filed on Jul. 12, 2022, the content of which is incorporated herein by reference in its entirety.

TECHNICAL FIELD

The present disclosure relates to the technical field of displaying, and in particular, to a display panel and a display device.

BACKGROUND

With the continuous development of network technology, more and more users need to perform operations such as account transactions on display devices. However, when users perform such operations in public places, personal information may be easily leaked by accessing bank accounts, paying bills or entering personal information, and the users suffer a risk of identity theft and privacy invasion. Therefore, display devices with anti-peeping functions have received more and more attention.

Display panels are usually provided with a grating structure on a light-exiting surface of the display panel to form an anti-peeping film. The grating structure can block the light emitted at a large viewing angle, thereby changing a wide viewing angle of the screen into a narrow viewing angle, and thus achieving the anti-peeping function. However, if the grating structure is provided in the display panel, the display panel is only in the anti-peeping mode. When multiple users need to view the screen at the same time, it will cause inconvenience and affect the user's experience.

SUMMARY

In view of this, a display panel and a display device are provided in embodiments of the present disclosure to solve the above need.

In a first aspect, an embodiment of the present disclosure provides a display panel, including: a substrate, a light-emitting element layer and a light-shielding layer. The light-emitting element layer is arranged at a side of the substrate and incudes primary light-emitting elements and auxiliary light-emitting elements. Each of the auxiliary light-emitting elements is arranged at a periphery of a respective one of the primary light-emitting elements. The light-shielding layer is arranged at a side of the light-emitting element layer facing away from the substrate. The light-shielding layer includes a light-shielding part and first openings corresponding to the primary light-emitting elements, and the light-shielding part covers the auxiliary light-emitting elements.

In a second aspect, an embodiment of the present disclosure provides a display device including a display panel, including: a substrate, a light-emitting element layer and a light-shielding layer. The light-emitting element layer is arranged at a side of the substrate and incudes primary light-emitting elements and auxiliary light-emitting elements. Each of the auxiliary light-emitting elements is arranged at a periphery of a respective one of the primary light-emitting elements. The light-shielding layer is arranged at a side of the light-emitting element layer facing away from the substrate. The light-shielding layer includes a light-shielding part and first openings corresponding to the primary light-emitting elements, and the light-shielding part covers the auxiliary light-emitting elements.

BRIEF DESCRIPTION OF DRAWINGS

In order to better illustrate technical solutions of embodiments of the present disclosure, the drawings of the embodiments are briefly described as below. The drawings described below are merely some of the embodiments of the present disclosure. Those skilled in the art can derive other drawings from these drawings.

DESCRIPTION OF EMBODIMENTS

For better illustrating the technical solutions of the present disclosure, the embodiments of the present disclosure are described in detail as below.

It should be understood that the embodiments described below are merely some of, rather than all of the embodiments of the present disclosure. On a basis of the embodiments in the present disclosure, all other embodiments obtained by those skilled in the art without paying creative effort are within the protection scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

In the description of this specification, it should be understood that the terms "substantially", "basically" "approximately", "about", "almost" and "roughly" described in the claims and embodiments of the present disclosure indicates a value that can be generally agreed within a reasonable process operation range or tolerance range, rather than an exact value.

It should be understood that, although the convex-concave structure may be described using the terms of "first", "second", "third", etc., in the embodiments of the present disclosure, the convex-concave structure will not be limited to these terms. These terms are merely used to distinguish convex-concave structures from one another. For example, without departing from the scope of the embodiments of the present disclosure, a first convex-concave structure may also be referred to as a second convex-concave structure, similarly, a second convex-concave structure may also be referred to as a first convex-concave structure, similarly, a second convex-concave structure may also be referred to as a third convex-concave structure, etc.

Through careful and in-depth research, Applicant provides solutions to the problems existing in the related.

Figure 1:
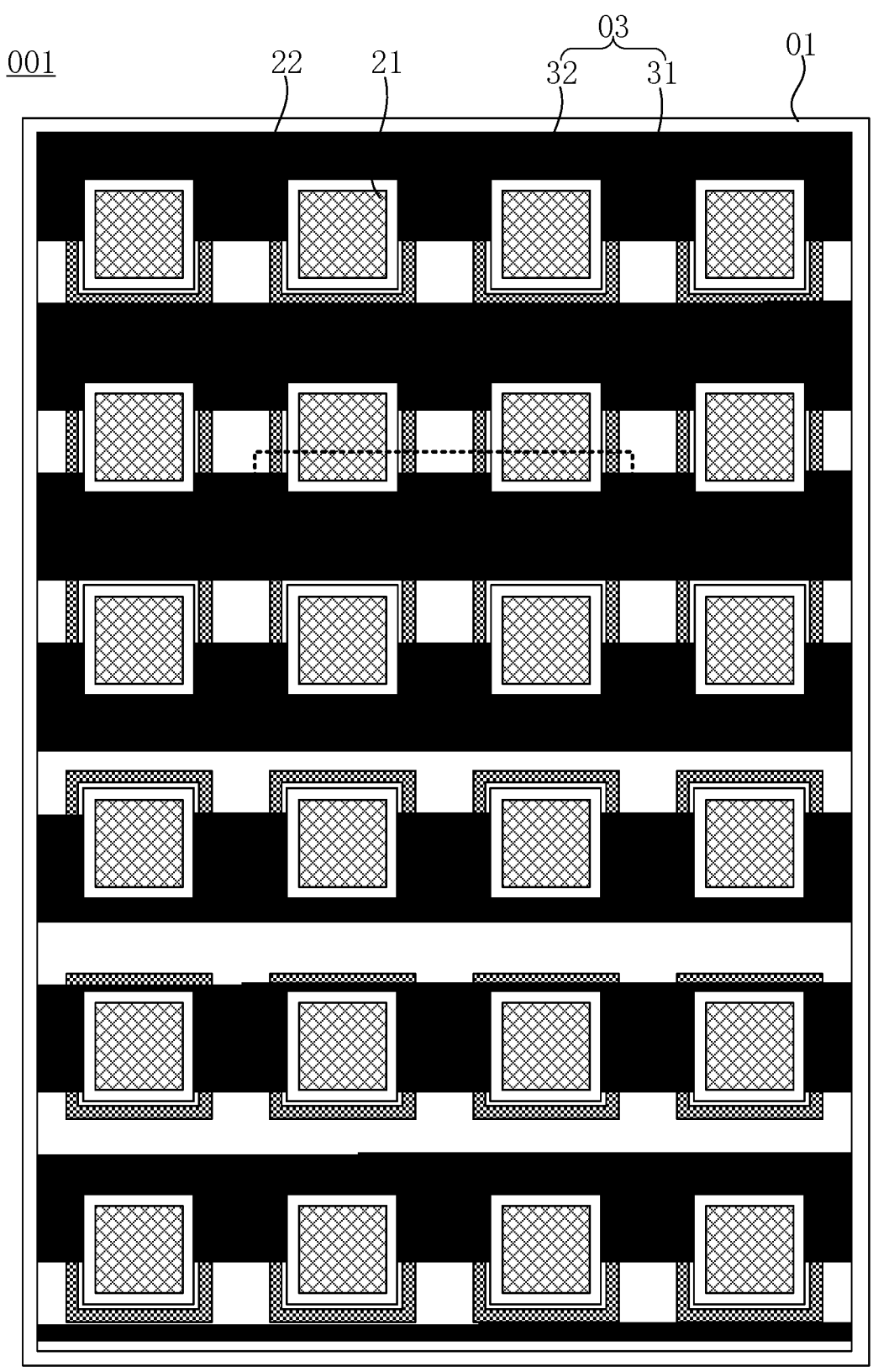
FIG. 1 is a schematic diagram of a display panel according to an embodiment of the present disclosure.
Figure 2:
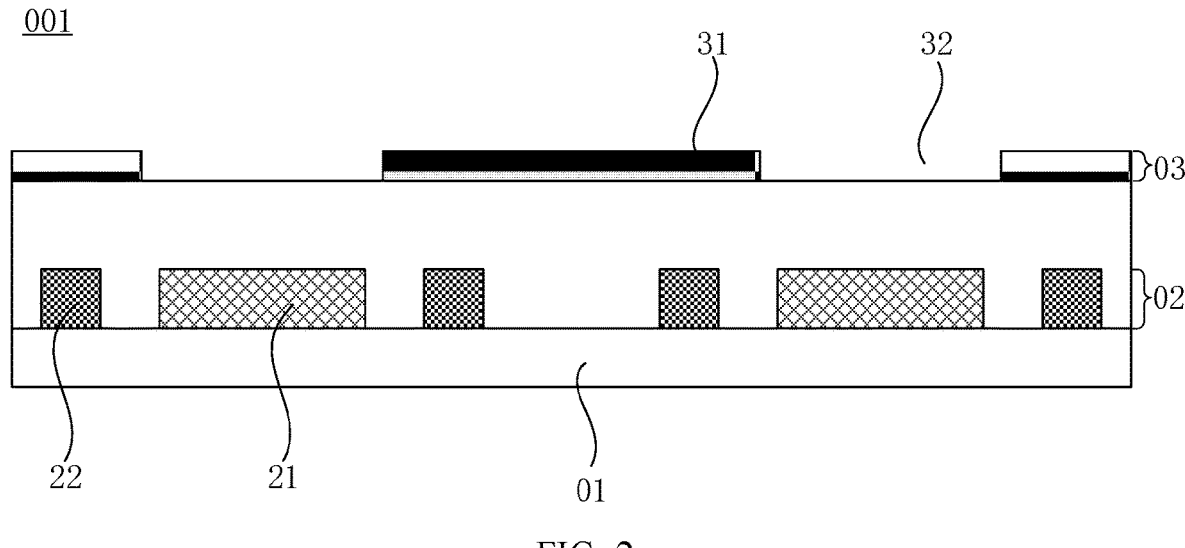
FIG. 2 is a sectional view of the display panel taken along M1-M2 shown in FIG. 1.

FIG. 1 is a schematic diagram of a display panel according to an embodiment of the present disclosure. FIG. 2 is a sectional view of the display panel taken along M1-M2 shown in FIG. 1.

As shown in FIG. 1 and FIG. 2, a display panel 001 provided by an embodiment of the present disclosure includes a substrate 01, a light-emitting element layer 02, and a light-shielding layer 03. The light-emitting element layer 02 is provided at a side of the substrate 01. The light-shielding layer 03 is provided at a side of the light-emitting element layer 02 facing away from the substrate 01, in another expression, the light-shielding layer 03 is provided at a side of the light-emitting element layer 02 facing a light-exiting surface of the display panel 001.

Please refer to FIG. 1 and FIG. 2, the light-emitting element layer 02 includes a plurality of primary light-emitting elements 21 and a plurality of auxiliary light-emitting elements 22, and each of the plurality of auxiliary light-emitting elements 22 is arranged at a periphery of one of the plurality of primary light-emitting elements 21. As shown in FIG. 1, the auxiliary light-emitting element 22 is arranged at a periphery of a corresponding primary light-emitting element 21 and is adjacent to the corresponding primary light-emitting element 21. In other words, the display panel 001 includes a plurality of subpixels, and at least one of the plurality of subpixels includes the primary light-emitting element 21 and the auxiliary light-emitting element 22 located at the periphery of the primary light-emitting element 21.

The primary light-emitting element 21 and the auxiliary light-emitting element 22 may be light-emitting elements of a same light-emitting type. For example, both the primary light-emitting element 21 and the auxiliary light-emitting element 22 may be organic light-emitting diodes (OLED), or may be Micro-LED, or may be Mini-LED.

The light-shielding layer 03 includes a light-shielding part 31 and a plurality of first openings 32 corresponding to the plurality of primary light-emitting elements 21, and the light-shielding part 31 covers the plurality of auxiliary light-emitting elements 22. The light-shielding layer 03 is provided with hollowed parts, and at least some of the hollowed parts are the first openings 32. At least part of the primary light-emitting element 21 is exposed by the corresponding first opening 32. In addition, in a direction perpendicular to a plane of the display panel 001, the light-shielding part 31 covers the auxiliary light-emitting element 22. In other words, in a direction perpendicular to a plane of the substrate 01, at least part of the primary light-emitting element 21 is exposed by the corresponding first opening 32, and the first opening 32 does not overlap with the auxiliary light-emitting element 22.

Figure 3:
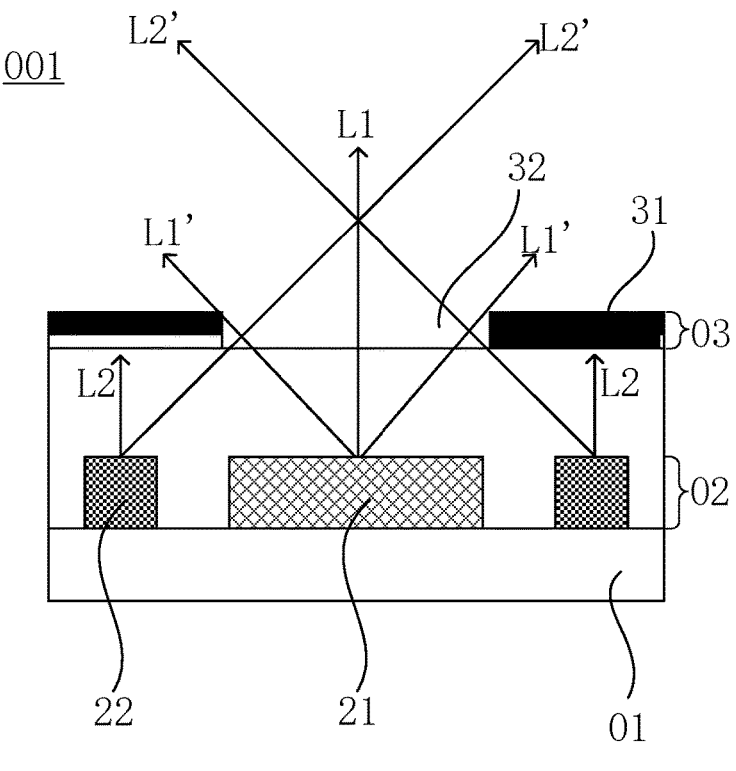
FIG. 3 is a schematic diagram showing light paths of a display panel in an anti-peering mode according to an embodiment of the present disclosure.
Figure 4:
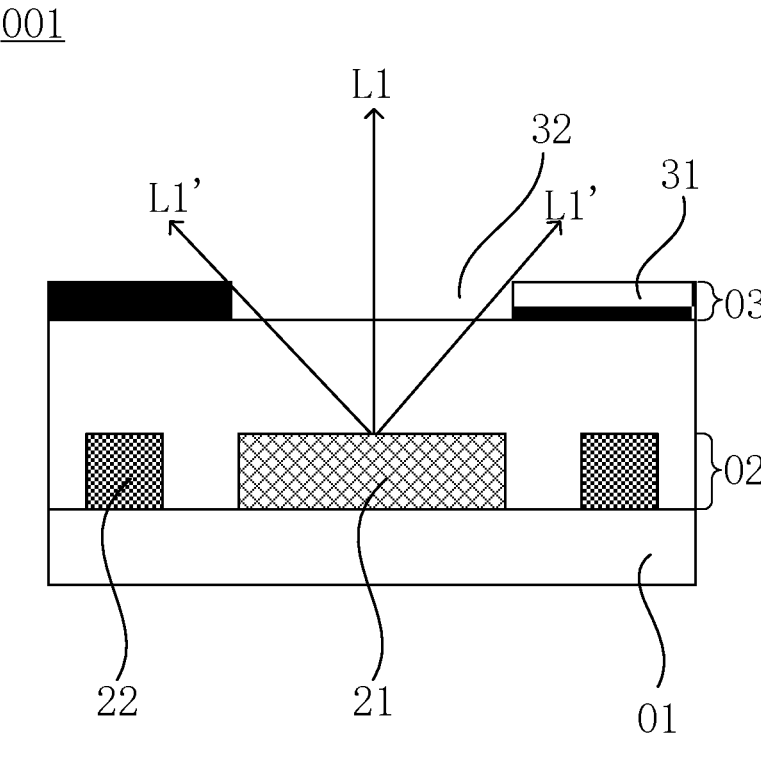
FIG. 4 is a schematic diagram showing light paths of a display panel in a normal mode according to an embodiment of the present disclosure.

FIG. 3 is a schematic diagram showing light paths of a display panel in an anti-peering mode according to an embodiment of the present disclosure. FIG. 4 is a schematic diagram showing light paths of a display panel in a normal mode according to an embodiment of the present disclosure.

In some embodiments, as shown in FIG. 3, the primary light-emitting element 21 corresponds to the first opening 32 of the light-shielding layer 03 and is exposed by the first opening 32 of the light-shielding layer 03. In this case, the primary light-emitting element 21 of the display panel 001 may serve as a major device for light-emitting and displaying in the display panel 001. In addition, the auxiliary light-emitting element 22 is arranged at the periphery of the primary light-emitting element 21, and the auxiliary light-emitting element 22 is covered by the light-shielding part 31 of the light-shielding layer 03. When the display panel is viewed at a normal viewing angle, viewers cannot see the light emitted by the auxiliary light-emitting element 22. The normal viewing angle may refer to a frontal viewing angle or a viewing angle when the viewer substantially faces the display panel 001.

Please refer to FIG. 3 again, when both the primary light-emitting element 21 and the auxiliary light-emitting element 22 emit light, that is, the display mode of the display panel is the anti-peering mode, if the viewer views the display panel at a frontal viewing angle or a small viewing angle, the light L1 that is emitted by the primary light-emitting element 21 and has a small exiting angle may travel through the first opening 32 in the light-shielding layer 03 and be seen by the viewer, however, the light L2 that is emitted by the auxiliary light-emitting element 22 and has a small exiting angle is blocked by the light-shielding part 31 of the light-shielding layer 03 and cannot be seen by the viewer; and if the viewer views the display panel at a large viewing angle, the light L1' that is emitted by the primary light-emitting element 21 and has a large exiting angle may travel through the first opening 32 in the light-shielding layer 03 and be seen by the viewer, and the light L2' that is emitted by the auxiliary light-emitting element 22 and has a large exiting angle may travel through the hollowed part (for example, the first opening 32) and be seen by the viewer. In some embodiments, at least part of the light emitted by the auxiliary light-emitting element 22 may be different from light emitted by the primary light-emitting element 21. In this case, when the viewer views the display panel at a large viewing angle, the light emitted by the auxiliary light-emitting element 22 and seen by the viewer is different from the light emitted by the primary light-emitting element 21 and seen by the viewer. As a result, the viewer viewing the display panel at a large viewing angle can see not only the light emitted by the primary light-emitting element 21, but also can see the interfering light emitted by the auxiliary light-emitting element 22. Therefore, the display panel 001 provided by embodiments of the present disclosure can achieve the effect of anti-peering, thereby well protecting the privacy of user.

It should be noted that the viewing angle in the present disclosure refers to an angle of a position of the viewer with respect to a center normal of the display panel 001 (that is, the normal passing through a center of the display panel 001 and perpendicular to the surface of the display panel). When this angle is substantially 0°, it can be regarded as the frontal viewing angle. When this angel is smaller than a minimum anti-peering angle, it can be regarded as a small viewing angle. When this angle is greater than or equal to the minimum anti-peering angle, the angle can be regarded as a large viewing angle. The minimum anti-peering angle is determined according to actual needs.

Please refer to FIG. 4, when the primary light-emitting element 21 emits light and the auxiliary light-emitting element 22 does not emit light, that is, when the display mode of the display panel is the normal mode, whether the viewer views the display panel at a large viewing angle or a small viewing angle, the viewer can only see the light L1 and L1' emitted by the primary light-emitting element 21, that is, the viewer can normally see the image displayed by the display panel 001 at different viewing angles.

To sum up, in the embodiments of the present disclosure, the auxiliary light-emitting element 22 is arranged at the periphery of the primary light-emitting element 21, and the auxiliary light-emitting element 22 is covered by the light-shielding part 31 of the light-shielding layer 03, whether the interfering light emitted by the auxiliary light-emitting element 22 can be seen at the large viewing angle is controlled by whether the auxiliary light-emitting element 22 emits light, such that switching between different display modes of the display panel is achieved, the controlling of the display mode of the display panel is more flexible, and the user experience is improved.

Figure 5:
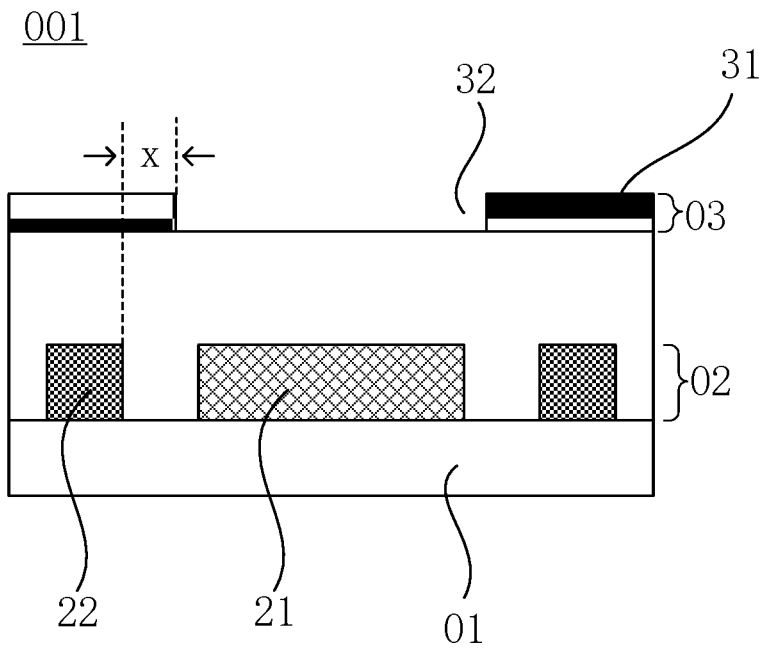
FIG. 5 is a schematic diagram showing a relationship between a light-emitting element and a light-shielding layer in a display panel according to an embodiment of the present disclosure.
Figure 6:
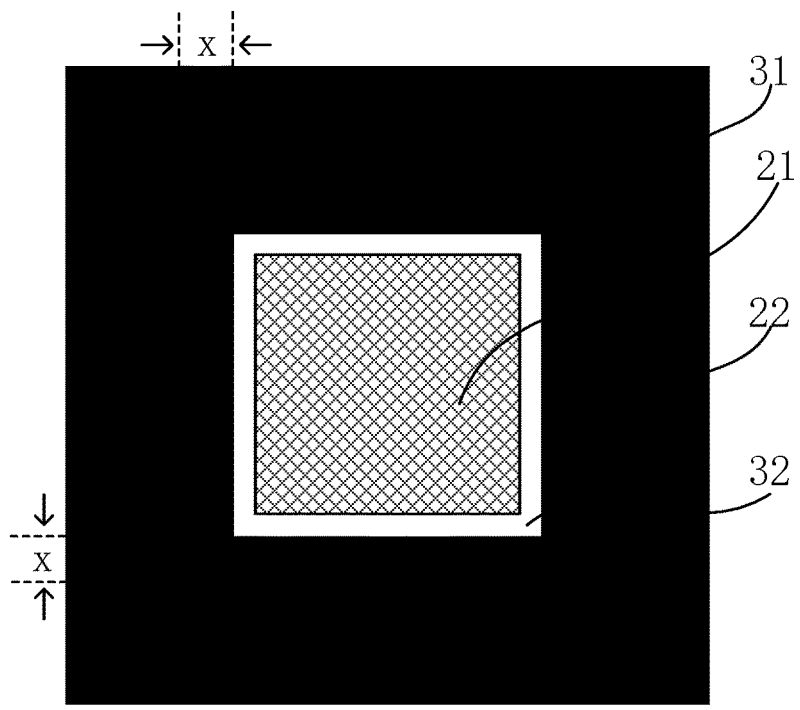
FIG. 6 is a schematic diagram showing projections of the light-emitting element and the light-shielding layer of the display panel shown in FIG. 5.

FIG. 5 is a schematic diagram showing a relationship between a light-emitting element and a light-shielding layer in a display panel according to an embodiment of the present disclosure. FIG. 6 is a schematic diagram showing projections of the light-emitting element and the light-shielding layer of the display panel shown in FIG. 5.

In one embodiment of the present disclosure, as shown in FIG. 5 and FIG. 6, in a projection of the first opening 32 corresponding to the primary light-emitting element 21 and a projection of the auxiliary light-emitting element 22 at the periphery of the primary light-emitting element 21 in a direction perpendicular to the plane of the display panel 001, the projection of the auxiliary light-emitting element 22 has an edge close to the projection of the first opening 32, a minimum distance between this edge of the projection of the auxiliary light-emitting element 22 and the edge of the first opening 32 is x, where x>0. That is, in a direction parallel to a plane of the display panel 001, the auxiliary light-emitting element 22 is covered by the light-shielding part 31, and a minimum distance from the auxiliary light-emitting element 22 to the edge of the light-shielding part 31 is greater than 0.

With the configuration in which the auxiliary light-emitting element 22 is covered by the light-shielding part 31 and the minimum distance from the auxiliary light-emitting element 22 to the edge of the light-shielding part 31 is greater than 0, it can avoid that the light having a small exiting angle that is emitted by the auxiliary light-emitting element 22 exits through the first opening 32, which may interfere the normal display of the display panel 001. In addition, since the minimum distance from the auxiliary light-emitting element 22 to the edge of the light-shielding part 31 is greater than 0, the viewer only sees the interfering light emitted by the auxiliary light-emitting element 22 at a certain large viewing angle. In addition, by adjusting the minimum distance from the auxiliary light-emitting element 22 to the edge of the light-shielding part 31, the viewing angle at which the viewer sees the interfering light emitted by the auxiliary light-emitting element 22 can be adjusted, that is, the minimum anti-peering angle of the display panel 001 can be adjusted. In addition, such configuration can also ensure that the auxiliary light-emitting element 22 is covered by the light-shielding part 31 when a process error occurs.

Figure 7:
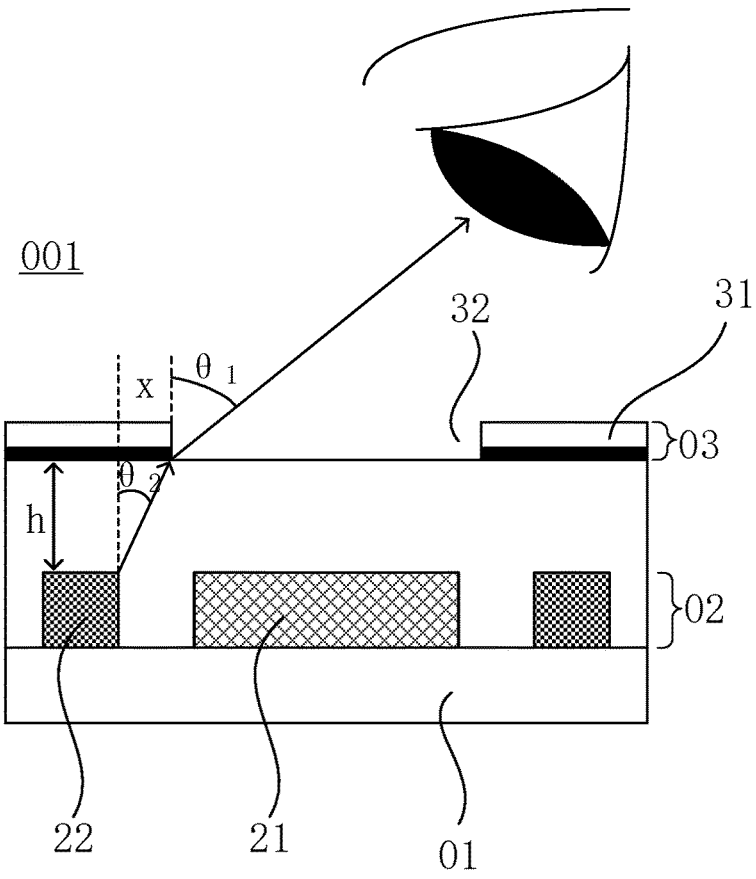
FIG. 7 is a schematic diagram showing a light path of light emitted by an auxiliary light-emitting element in a display panel according to an embodiment of the present disclosure.

FIG. 7 is a schematic diagram showing a light path of light emitted by an auxiliary light-emitting element in a display panel according to an embodiment of the present disclosure.

In one embodiment, as shown in FIG. 7, it is assumed that the viewer can see the interfering light emitted by the auxiliary light-emitting element 22 when the viewing angle is greater than or equal to $\theta_1$, that is, the minimum anti-peering angle of the display panel 001 is $\theta_1$; the refractive index of the light emitted by the auxiliary light-emitting element 22 in the medium through which the light passes before arriving the light-shielding layer 03 is $n_2$, that is, the refractive index of the layer between the auxiliary light-emitting element 22 and the light-shielding layer 03 is $n_2$; the refractive index of the light emitted by the auxiliary light-emitting element 22 in the medium through which the light passes after exiting the light-shielding layer 03 is $n_1$, that is, the refractive index of the layer at a side of the light-shielding layer 03 facing away from the light-emitting element layer 02 is $n_1$. Then, according to the law of refraction, a minimum angle between the direction perpendicular to the plane of the display panel 001 and the light that is emitted by the auxiliary light-emitting element 22 and seen by the viewer at the viewing angle $\theta_1$ is $\theta_2$, and $\theta_2$ satisfies:

$$\theta_2 = \frac{\theta_1}{n_2} * n_1$$

Please refer to FIG. 7, it is assumed that the minimum distance between the auxiliary light-emitting element 22 and the light-shielding layer 03 is h, that is, the thickness of the layer between the auxiliary light-emitting element 22 and the light-shielding layer 03 is h. Then, according to the trigonometric formula:

$$x = h * \tan \theta_2$$

Then, the following formula can be obtained by transforming the above-mentioned two formulas:

$$x = \frac{h * n_1 \sin\theta_1}{\sqrt{n_2^2 - n_1^2 * \sin\theta_1}}$$

In order to prevent the interfering light of the auxiliary light-emitting element 22 from being seen by the viewer at the minimum anti-peering angle, x satisfies:

$$x > \frac{h * n_1 \sin\theta_1}{\sqrt{n_2^2 - n_1^2 * \sin\theta_1}}$$

Since the display panel 001 includes a large number of layers, for example, in some embodiments, multiple layers may be arranged between the light-emitting element layer 02 and the light-shielding layer 03, and other multiple layers may be arranged at a side of the light-shielding layer 03 facing away from the light-emitting element layer 02, Herein, n1 and n2 can adopt some empirical values, for example, n1=1, and n2=1.5.

The minimum anti-peering angle can be selected according to actual needs. For example, the minimum anti-peering angle is any one of $\theta_1$=30°, 45°, or 60°.

In the embodiments of the present disclosure, the display mode of the display panel 100 includes the anti-peering mode, and both the primary light-emitting element 21 and the auxiliary light-emitting element 22 emit light in the anti-peering mode. In the anti-peering mode, light emission of the primary light-emitting element 21 can ensure that the viewer can normally see the displayed image whether at the frontal viewing angle or the small viewing angle, while light emission of the auxiliary light-emitting element 22 makes the viewer at the large viewing angle see the interfering light emitted by the auxiliary light-emitting element 22, thereby achieving the anti-peering effect. In addition, the distance between the auxiliary light-emitting element 22 and the first opening 22 can be reasonably determined according to the above-mentioned formulas, thereby avoiding leakage of the light emitted by the auxiliary light-emitting element 22 due to refractions in different layers when the display panel is viewed at the small viewing angle.

In the embodiments of the present disclosure, the display mode of the display panel 001 further includes a normal display. In the normal mode, the primary light-emitting element 21 emits light and the auxiliary light-emitting element 22 does not emit light. In the normal mode, light emission of the primary light-emitting element 21 can ensure that the viewer can see normally see the displayed image, while not light emission of the auxiliary light-emitting element 22 can avoid that the interfering light is seen by the viewer, such that the display panel 011 can normally display images.

In order to effectively interfere the light emitted by the primary light-emitting element 21 by the light emitted by the auxiliary light-emitting element 22, the image displayed by the plurality of auxiliary light-emitting elements 22 when emitting light is different from the image displayed by the plurality of primary light-emitting elements 21 when emitting light. For example, the plurality of auxiliary light-emitting elements 22 displays a mosaic image when emitting light, so as to interfere with the image displayed by the plurality of primary light-emitting elements 21.

In one embodiment of the present disclosure, when the display panel 001 is in the anti-peering mode, brightness of the plurality of auxiliary light-emitting elements 22 is greater than brightness of the plurality of primary light-emitting elements 21. On the one hand, with the brightness of the auxiliary light-emitting elements 22 being greater, the auxiliary light-emitting elements 22 can have a smaller area, thereby ensuring that the display panel 001 has a higher pixel density. On the other hand, with the brightness of the auxiliary light-emitting elements 22 being greater than the brightness of the primary light-emitting elements 21, the viewer can see an interfering image with higher brightness at the large viewing angle, thereby improving the privacy protection effect of the display panel 001.

Figure 8:
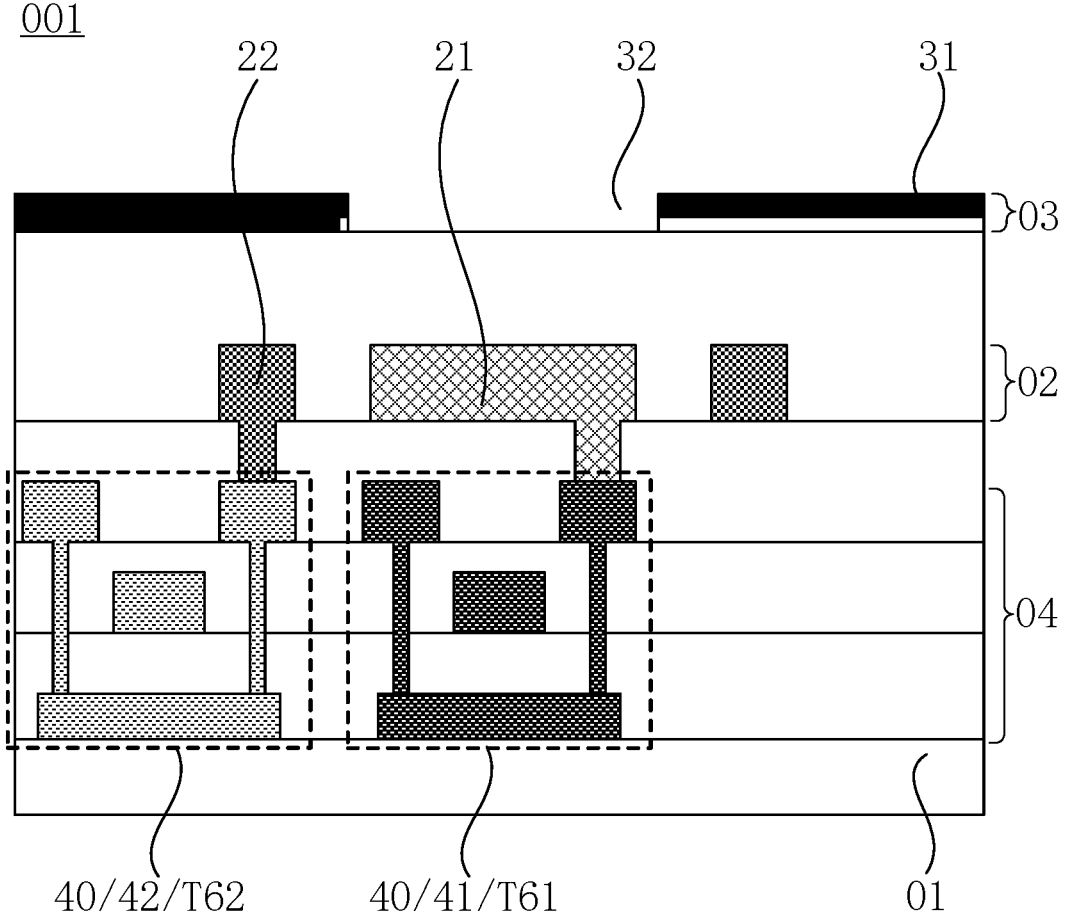
FIG. 8 is a schematic diagram showing a connection between a light-emitting element and a pixel circuit in a display panel according to an embodiment of the present disclosure.
Figure 9:
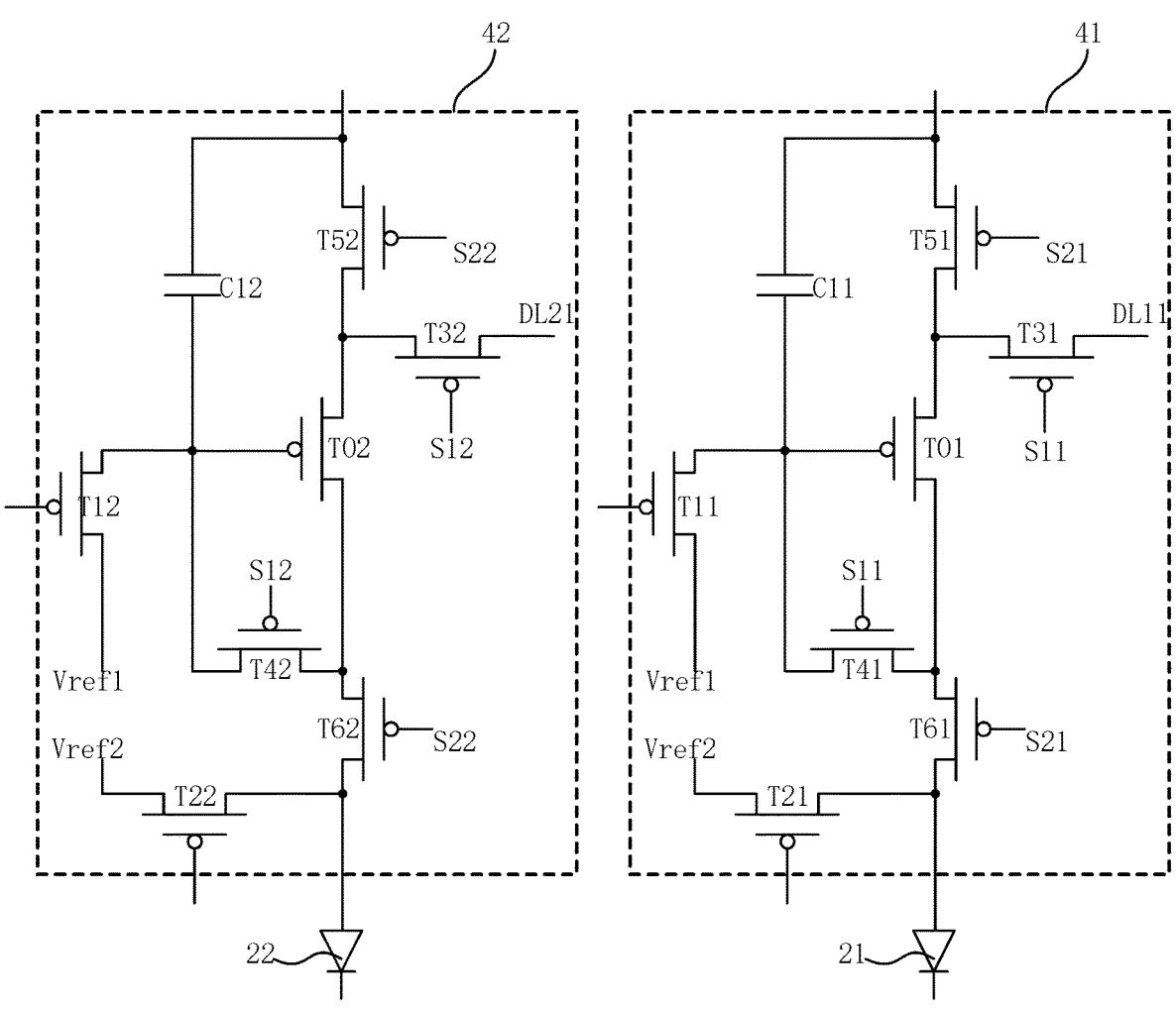
FIG. 9 is a schematic diagram showing an equivalent circuit of the pixel circuit and the light-emitting element shown in FIG. 8.

FIG. 8 is a schematic diagram showing a connection between a light-emitting element and a pixel circuit in a display panel according to an embodiment of the present disclosure. FIG. 9 is a schematic diagram showing an equivalent circuit of the pixel circuit and the light-emitting element shown in FIG. 8.

In one embodiment of the present disclosure, as shown in FIG. 8 and FIG. 9, the display panel 001 further includes a pixel circuit array layer 04, and the pixel circuit array layer 04 includes a plurality of pixel circuits 40. Each of the plurality of pixel circuits 40 is configured to supply a light-emitting driving voltage or a light-emitting driving current to the light-emitting element electrically connected thereto. The plurality of pixel circuits 40 in the pixel circuit array layer 04 includes: a first pixel circuit 41 and a second pixel circuit 42. The first pixel circuit 41 is electrically connected to the primary light-emitting element 21, and the second pixel circuit 42 is electrically connected to the auxiliary light-emitting element 22. That means in the embodiments of the present disclosure, the primary light-emitting element 21 and the auxiliary light-emitting element 22 are electrically connected to different pixel circuits 40, respectively.

As shown in FIG. 9, the first pixel circuit 41 may include a light-emitting driving transistor T01, a first reset transistor T11, a second reset transistor T21, a data voltage input transistor T31, a threshold capturing transistor T41, a power supply voltage input transistor T51, a light-emitting controlling transistor T61 and a storage capacitor C11.

A first electrode of the storage capacitor C11 is electrically connected to a gate of the light-emitting driving transistor T01, and a second electrode of the storage capaci-tor C11 is electrically connected to an input terminal of the power supply voltage input transistor T51.

An input terminal of the first reset transistor T11 is electrically connected to a first reset signal line Vref1, an output terminal of the first reset transistor T11 is electrically connected to the gate of the light-emitting driving transistor T01, and the first reset transistor T11 is configured to reset the gate of the light-emitting driving transistor T01.

An input terminal of the second reset transistor T21 is electrically connected to a second reset signal line Vref2, an output terminal of the second reset transistor T21 is electrically connected to the primary light-emitting element 21, and the second reset transistor T21 is configured to reset an anode or a cathode of the primary light-emitting element 21. A signal of the first reset signal line Vref1 may be the same as or different from a signal of the second reset signal line Vref2.

An input terminal of the data voltage input transistor T31 is electrically connected to a data line DL11, an output terminal of the data voltage input transistor T31 is electrically connected to an input terminal of the light-emitting driving transistor T01, and a control terminal of the data voltage input transistor T31 is electrically connected to a first scanning line S11. An input terminal of the threshold capturing transistor T41 is electrically connected to the output terminal of the light-emitting driving transistor T01, an output terminal of the threshold capturing transistor T41 is electrically connected to the gate of the light-emitting driving transistor T01, and a control terminal of the threshold capturing transistor T41 is electrically connected to the first scanning line S11. The data voltage input transistor T31 cooperates with the threshold capturing transistor T41, to input the data voltage to the gate of the light-emitting driving transistor T01.

A control terminal of the power supply voltage input transistor T51 is electrically connected to a second scanning line S21, and the power supply voltage input transistor T51 is configured to input a first power supply voltage to the input terminal of the light-emitting driving transistor T01.

An input terminal of the light-emitting controlling transistor T61 is electrically connected to the output terminal of the light-emitting driving transistor T01, an output terminal of the light-emitting controlling transistor T61 is electrically connected to the primary light-emitting element 21, and a control terminal of the light-emitting controlling transistor T61 is electrically connected to the second scanning line S21. The light-emitting controlling transistor T61 is configured to transmit a light-emitting driving current generated by the light-emitting driving transistor T01 to the primary light-emitting element 21.

As shown in FIG. 9, the second pixel circuit 42 may include a light-emitting controlling transistor T02, a first reset transistor T12, a second reset transistor T22, a data voltage input transistor T32, a threshold capturing transistor T42, a power supply voltage input transistor T52, a light-emitting controlling transistor T62 and a storage capacitor C12. The connection manner of each transistor in the second pixel circuit 42 is substantially the same as that in the first pixel circuit 41, and details are not repeated herein. In addition, in the second pixel circuit 42, an input terminal of the data voltage input transistor T32 is connected to a data line DL21, a control terminal of the data voltage input transistor T32 and a control terminal of the threshold capturing transistor T42 are each electrically connected to a first scanning line S12, an output terminal of the light-emitting controlling transistor T62 is electrically connected to the auxiliary light-emitting element 22, and a control terminal of the power supply voltage input transistor T52 and a control terminal of the light-emitting controlling transistor T62 are each electrically connected to a second scanning line S22.

It should be noted that FIG. 9 merely shows an exemplary structure of the pixel circuit 40, and the pixel circuit 40 in the pixel circuit array layer 04 may also be implemented in other structures than the structure shown in FIG. 9. In addition, FIG. 9 shows that the equivalent circuit of the first pixel circuit 41 is the same as the equivalent circuit of the second pixel circuit 42; however, in some other embodiments of the present disclosure, the equivalent circuit of the first pixel circuit 41 may also be different from the equivalent circuit of the second pixel circuit 42.

Figure 10:
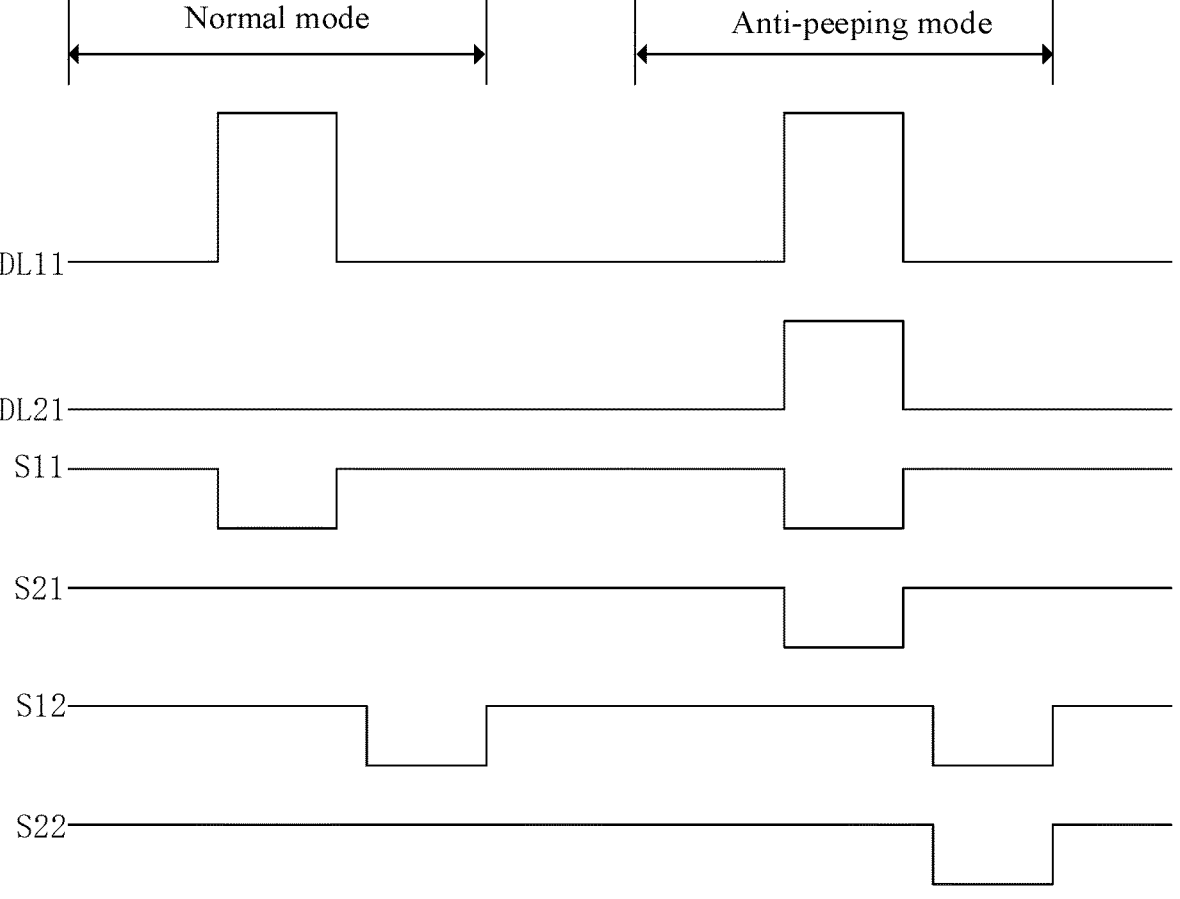
FIG. 10 is a timing diagram of the equivalent circuit shown in FIG. 9.

FIG. 10 is a timing diagram of the equivalent circuit shown in FIG. 9.

As shown in FIG. 9 and FIG. 10, in the normal mode, the data line DL11 transmits the data voltage to a data voltage input transistor T31 in the first pixel circuit 41, the first scanning line S11 that is electrically connected to the data voltage input transistor T31 transmits a valid-level signal, and the data voltage is inputted to the light-emitting driving transistor T01 through the turned-on data voltage input transistor T31 in the first pixel circuit 41; and, neither the data line DL21 nor the first scanning line S12 electrically connected to the second pixel circuit 42 transmits a valid-level signal, and thus the light-emitting driving transistor T02 in the second pixel circuit 42 does not receive any data voltage.

In addition, in the normal mode, each of the power supply voltage input transistor T51 and the light-emitting controlling transistor T61 in the first pixel circuit 41 receives a valid-level signal transmitted by the second scanning signal line S21, and the primary light-emitting element 21 receives the light-emitting driving current generated by the light-emitting controlling transistor T01 in the first pixel circuit 41; and, the second scanning signal line S22 that is electrically connected to the second pixel circuit 42 does not transmit a valid-level signal, and thus the auxiliary light-emitting element 22 is electrically insulated from the second pixel circuit 42.

That is, in the normal mode, the primary light-emitting element 21 that is electrically connected to the first pixel circuit 41 can emit light, and the auxiliary light-emitting element 22 that is electrically connected to the second pixel circuit 42 does not emit light.

As shown in FIG. 9 and FIG. 10, in the anti-peering mode, the data line DL11 transmits a data voltage to the data voltage input transistor T31 in the first pixel circuit 41, the first scanning line S11 that is electrically connected to the data voltage input transistor T31 transmits a valid-level signal, and the data voltage is inputted to the light-emitting driving transistor T01 through the turned-on data voltage input transistor T31 in the first pixel circuit 41; and, the data line DL21 transmits a data voltage to the data voltage input transistor T32 in the second pixel circuit 42, the first scanning line S12 that is electrically connected to the data voltage input transistor T32 transmits a valid-level signal, and the data voltage is inputted to the light-emitting driving transistor T02 through the turned-on data voltage input transistor T32 in the second pixel circuit 42.

In addition, in the anti-peering mode, each of the power supply voltage input transistor T51 and the light-emitting controlling transistor T61 in the first pixel circuit 41 receives a valid-level signal transmitted by the second scanning signal line S21, and the primary light-emitting element 21 receives a light-emitting driving current generated by the light-emitting controlling transistor T01 in the first pixel circuit 41; and, each of the power supply voltage input transistor T52 and the light-emitting controlling transistor T62 in the second pixel circuit 42 receives a valid-level signal transmitted by the second scanning signal line S22, and the auxiliary light-emitting element 22 receives a light-emitting driving current generated by the light-emitting controlling transistor T02 in the second pixel circuit 42.

That is, in the anti-peering mode, both the primary light-emitting element 21 that is electrically connected to the first pixel circuit 41 and the auxiliary light-emitting element 22 that is electrically connected to the second pixel circuit 42 emit light.

In one embodiment, as shown in FIG. 10, in the anti-peering mode, a potential of the data voltage transmitted by the data line DL11 to the data voltage input transistor T31 in the first pixel circuit 41 is greater than a potential of the data voltage transmitted by the data line DL21 to the data voltage input transistor T32 in the second pixel circuit 42, then it can achieve that the brightness of the auxiliary light-emitting element 22 is greater than the brightness of the primary light-emitting element 21 when the display panel 001 is in the anti-peering mode.

Figure 11:
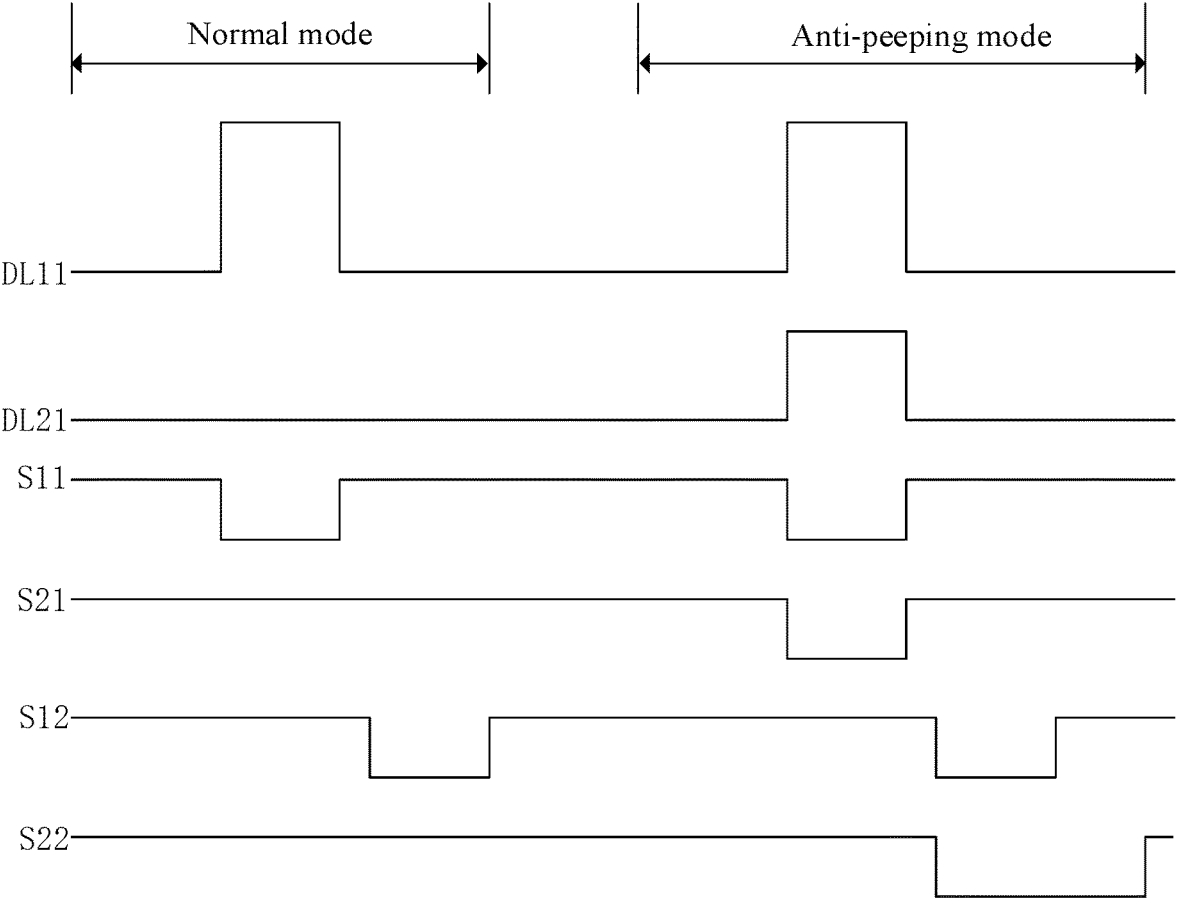
FIG. 11 is another timing diagram of the equivalent circuit shown in FIG. 9.

FIG. 11 is another timing diagram of the equivalent circuit shown in FIG. 9.

In another embodiment of the present disclosure, as shown in FIG. 11 and FIG. 9, in the anti-peering mode, a duration during which a valid-level signal transmitted by the second scanning signal line S22 is received by the power supply voltage input transistor T52 and the light-emitting controlling transistor T62 in the second pixel circuit 42 is greater than a duration during which a valid-level signal transmitted by the second scanning signal line S21 is received by the power supply voltage input transistor T51 and the light-emitting controlling transistor T61 in the first pixel circuit 41, then it can achieve that the brightness of the auxiliary light-emitting element 22 is greater than the brightness of the primary light-emitting element 21 when the display panel 001 is in the anti-peering mode.

Figure 12:
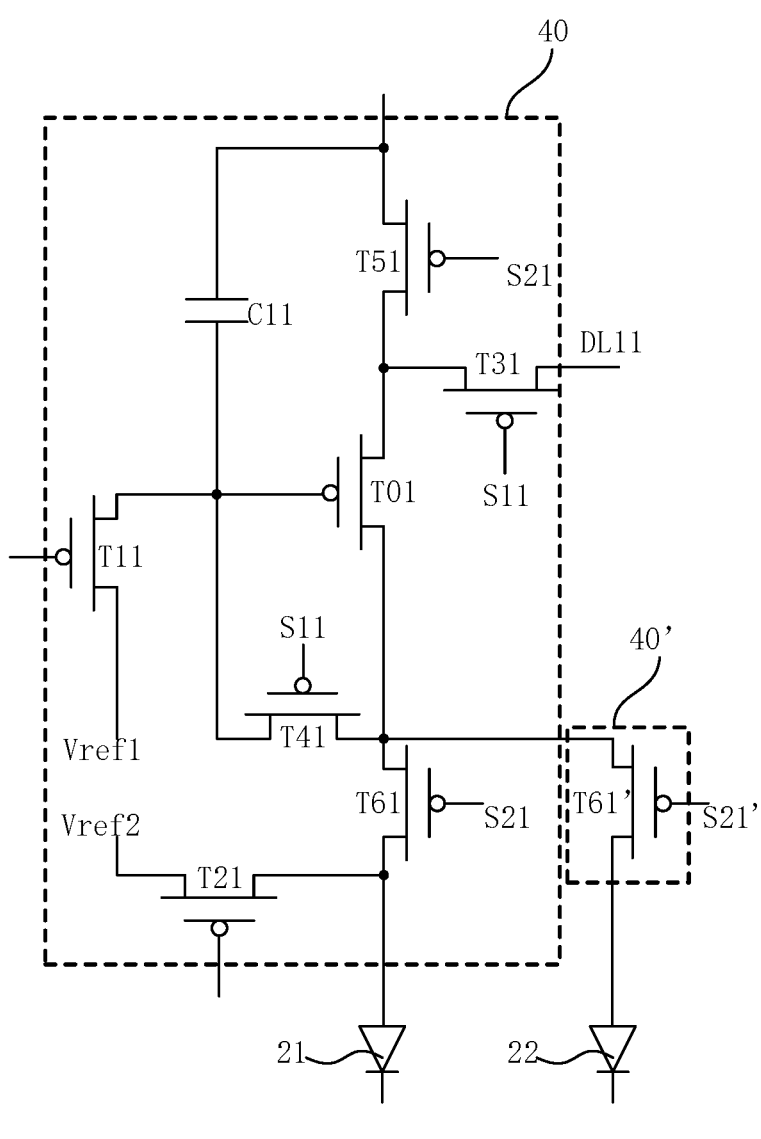
FIG. 12 is a schematic diagram showing an equivalent circuit of a pixel circuit and a light-emitting element in a display panel according to an embodiment of the present disclosure.
Figure 13:
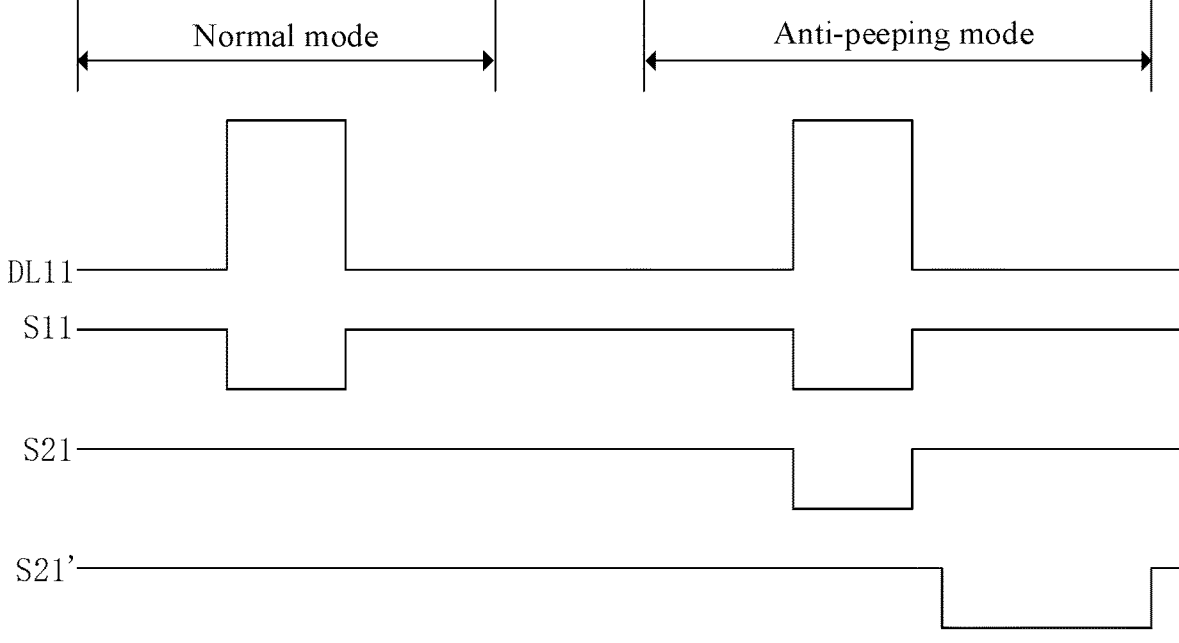
FIG. 13 is a timing diagram of the equivalent circuit shown in FIG. 12.

FIG. 12 is a schematic diagram showing an equivalent circuit of a pixel circuit and a light-emitting element in a display panel according to an embodiment of the present disclosure. FIG. 13 is a timing diagram of the equivalent circuit shown in FIG. 12.

In one embodiment of the present disclosure, as shown in FIG. 12, the display panel 001 further includes a pixel circuit array layer 04, and the pixel circuit array layer 04 includes a plurality of pixel circuits 40 and a mode controlling module 40'.

The mode controlling module 40' is configured to control a light-emitting state of the auxiliary light-emitting element 22 according to the display mode of the display panel 001. In an example, the mode controlling module 40' controls the auxiliary light-emitting element 22 not to emit light in the normal mode and controls the auxiliary light-emitting element 22 to emit light in the anti-peering mode.

The pixel circuit 40 is electrically connected to the primary light-emitting element 21, and the pixel circuit 40 is also electrically connected to the auxiliary light-emitting element 22 through the mode controlling module 40'.

A structure of the pixel circuit 40 in this embodiment may be the same as the structure of the first pixel circuit 41 and the second pixel circuit 42 in the previous embodiments, and details are not repeated herein. In this embodiment, the mode control module 40' may be an additionally provided structure independent of the pixel circuit 40.

As shown in FIG. 12 and FIG. 13, in the anti-peering mode, in response to a valid-level signal (a low level)

provided by the second scanning line S21, the pixel circuit 40 transmits a driving current generated by the light-emitting driving transistor T01 to the primary light-emitting element 21, and the driving current drives the primary light-emitting element 21 to emit light; and, the mode controlling module 40' controls a transmission path between the pixel circuit 40 and the auxiliary light-emitting element 22 to be conductive, such that a driving current generated by the light-emitting driving transistor T0 is synchronously transmitted to the auxiliary light-emitting element 22, so as to drive the auxiliary light-emitting element 22 to emit light simultaneously.

Furthermore, as shown in FIG. 12, the mode controlling module 40' may include an auxiliary light-emitting controlling transistor T61' electrically connected between the light-emitting driving transistor T01 and the auxiliary light-emitting element 22. A control terminal of the auxiliary light-emitting controlling transistor T61' is electrically connected to a third scanning line S21'.

Please refer to FIG. 12 and FIG. 13 again, in the normal mode, in response to a valid-level signal (a low level) provided by the second scanning line S21, the pixel circuit 40 transmits a driving current generated by the light-emitting driving transistor T01 to the primary light-emitting element 21, and the driving current drives the primary light-emitting element 21 to emit light; and, the mode controlling module 40' controls a transmission path between the pixel circuit 40 and the auxiliary light-emitting element 22 to be disconnected, such that a driving current generated by the light-emitting driving transistor T0 can be controlled not to be transmitted to the auxiliary light-emitting element 22, and thus the auxiliary light-emitting element 22 does not emit light.

Based on the structure described above, in the anti-peering mode, the auxiliary light-emitting element 22 emits light by sharing, with the primary light-emitting element 21, the driving current provided by a same pixel circuit 42, without needing to provide an additional circuit for providing a driving current to the auxiliary light-emitting element 22. Such a configuration simplifies a circuit design of the display panel 001, reduces the space occupied by the circuit in the display panel 001, and is beneficial to increasing the pixel density.

Figure 14:
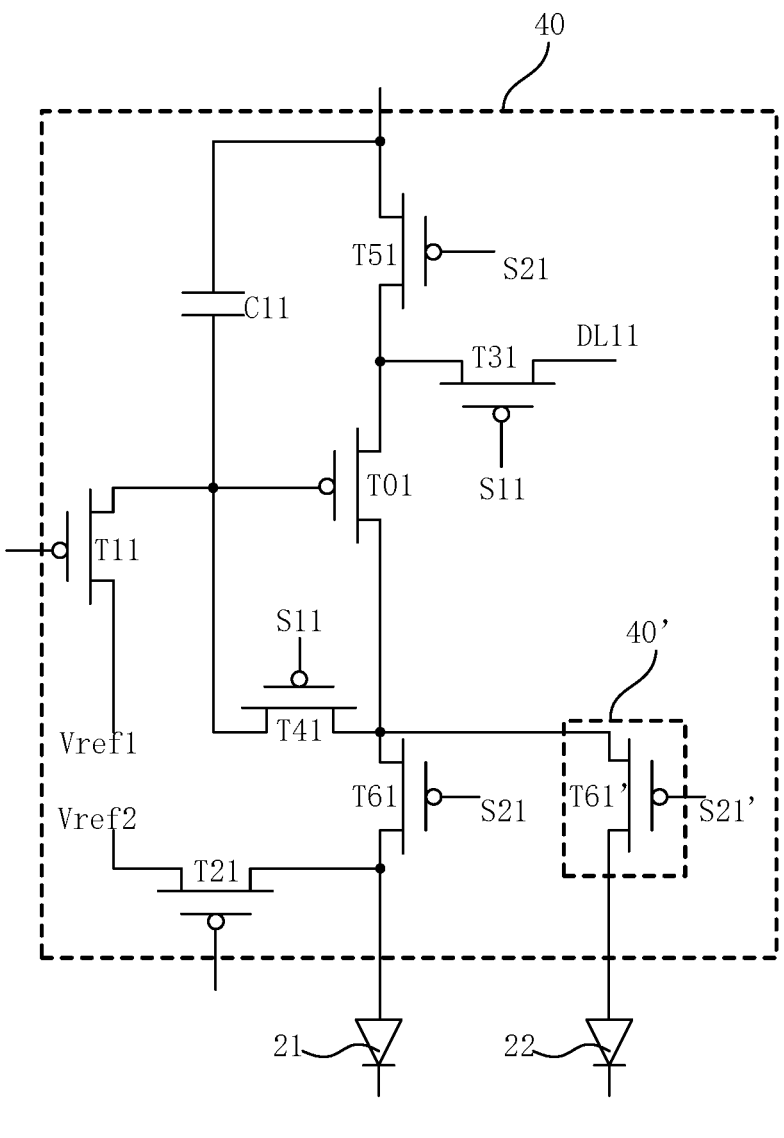
FIG. 14 is a schematic diagram showing an equivalent circuit of a pixel circuit and a light-emitting element in a display panel according to an embodiment of the present disclosure.

FIG. 14 is a schematic diagram showing an equivalent circuit of a pixel circuit and a light-emitting element in a display panel according to an embodiment of the present disclosure.

In one embodiment of the present disclosure, the display panel 001 further includes a pixel circuit array layer 04, and the pixel circuit array layer 04 includes a plurality of pixel circuits 40 and a mode controlling module 40'.

The mode controlling module 40' is configured to control a light-emitting state of the auxiliary light-emitting element 22 according to a display mode of the display panel 001. In an example, the mode controlling module 40' controls the auxiliary light-emitting element 22 not to emit light in the normal mode and controls the auxiliary light-emitting element 22 to emit light in the anti-peering mode.

The pixel circuit 40 includes a light-emitting driving transistor T01, a light-emitting controlling transistor T61, and an auxiliary light-emitting controlling transistor T61'. The light-emitting controlling transistor T61 is electrically connected between the light-emitting driving transistor T01 and the primary light-emitting element 21. The auxiliary light-emitting controlling transistor T61' is electrically connected between the light-emitting driving transistor T01 and the auxiliary light-emitting element 22. A control terminal of the auxiliary light-emitting controlling transistor T61' is electrically connected to a third scanning line S21'. The mode controlling module 40' is reused as the auxiliary light-emitting controlling transistor T61'. In this configuration, the mode controlling module 40' can be reused as the auxiliary light-emitting controlling transistor T61' in the pixel circuit 40.

As shown in FIG. 14 and FIG. 13, in the anti-peering mode, the light-emitting controlling transistor T61 controls to transmit a driving current generated by the light-emitting driving transistor T01 to the primary light-emitting element 21, and the driving current drives the primary light-emitting element 21 to emit light; and, the auxiliary light-emitting controlling transistor T61' controls to transmit a driving current generated by the light-emitting driving transistor T01 to the auxiliary light-emitting element 22, and the driving current drives the auxiliary light-emitting element 22 to emit light simultaneously.

As shown in FIG. 14 and FIG. 13, in the normal mode, the light-emitting controlling transistor T61 controls to transmit a driving current generated by the light-emitting driving transistor T01 to the primary light-emitting element 21, and the driving current drives the primary light-emitting element 21 to emit light; and, the auxiliary light-emitting controlling transistor T61' controls a driving current generated by the light-emitting driving transistor T01 not to flow to the auxiliary light-emitting element 22, and thus the auxiliary light-emitting element 22 does not emit light.

Based on the structure described above, in the anti-peering mode, the auxiliary light-emitting element 22 emits light by sharing, with the primary light-emitting element 21, the driving current provided by a same pixel circuit 40. Such a configuration simplifies a circuit design of the display panel 001, reduces the space occupied by the circuit in the display panel 001, and is beneficial to increasing the pixel density.

Figure 15:
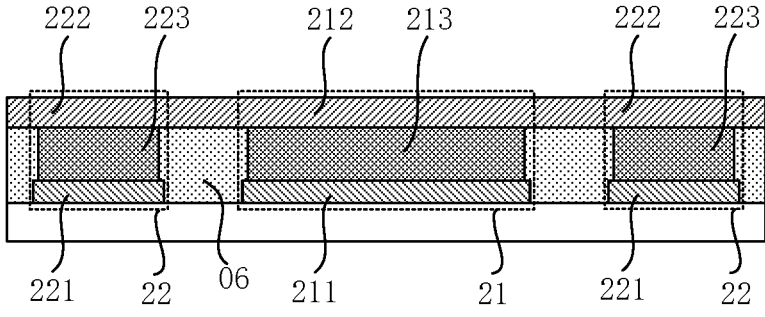
FIG. 15 is a schematic diagram showing a primary light-emitting element and an auxiliary light-emitting element in a display panel according to an embodiment of the present disclosure.
Figure 16:
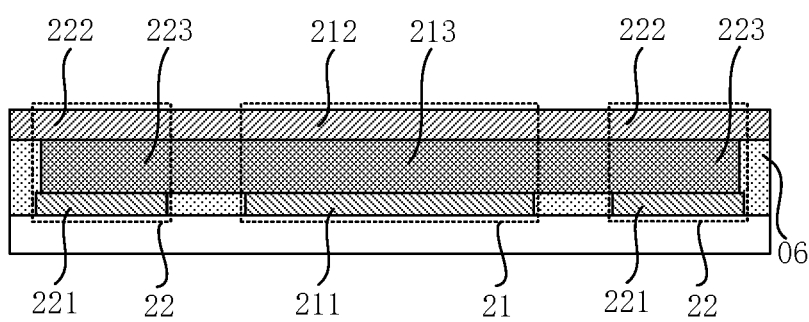
FIG. 16 is a schematic diagram showing a primary light-emitting element and an auxiliary light-emitting element in a display panel according to an embodiment of the present disclosure.

FIG. 15 is a schematic diagram showing a primary light-emitting element and an auxiliary light-emitting element in a display panel according to an embodiment of the present disclosure. FIG. 16 is a schematic diagram showing a primary light-emitting element and an auxiliary light-emitting element in a display panel according to an embodiment of the present disclosure.

In one embodiment of the present disclosure, as shown in FIG. 15 and FIG. 16, both the primary light-emitting element 21 and the auxiliary light-emitting element 22 may be organic light-emitting elements. The primary light-emitting element 21 includes an anode 211, a cathode 212, and an organic light-emitting layer 213 that is located between the anode 211 and the cathode 212. The auxiliary light-emitting element 22 includes an anode 221, a cathode 222, and an organic light-emitting layer 223 that is located between the anode 221 and the cathode 222.

As shown in FIG. 15 and FIG. 16, the cathode 212 of the primary light-emitting element 21 is electrically connected to the cathode 222 of the auxiliary light-emitting element 22, and the anode 211 of the primary light-emitting element 21 is electrically insulated from the anode 221 of the auxiliary light-emitting element 22. In this way, the primary light-emitting element 21 and the auxiliary light-emitting element 22 can be individually controlled.

In one embodiment of the present disclosure, as shown in FIG. 15, the organic light-emitting layer 213 of the primary light-emitting element 21 and the organic light-emitting layer 223 of the auxiliary light-emitting element 22 at the periphery of the primary light-emitting element 21 are independent structures. For example, as shown in FIG. 15, the display panel 001 further includes a pixel define layer 06. The organic light-emitting layer 213 of the primary light-emitting element 21 and the organic light-emitting layer 223 of the auxiliary light-emitting element 22 at the periphery of the primary light-emitting element 21 are arranged in different openings of the pixel define layer 06, respectively. With such configuration, the primary light-emitting element 21 and the auxiliary light-emitting element 22 can be flexibly designed, respectively.

In one embodiment of the present disclosure, as shown in FIG. 16, the organic light-emitting layer 213 of the primary light-emitting element 21 and the organic light-emitting layer 223 of the auxiliary light-emitting element 22 at the periphery of the primary light-emitting element 21 are of an integral structure. For example, as shown in FIG. 16, the display panel 001 further includes a pixel define layer 06. The organic light-emitting layer 213 of the primary light-emitting element 21 and the organic light-emitting layer 223 of the auxiliary light-emitting element 22 at the periphery of the primary light-emitting element 21 are arranged in a same opening of the pixel define layer 06. This configuration does not require high process precision and thus is easy to implement.

Figure 17:
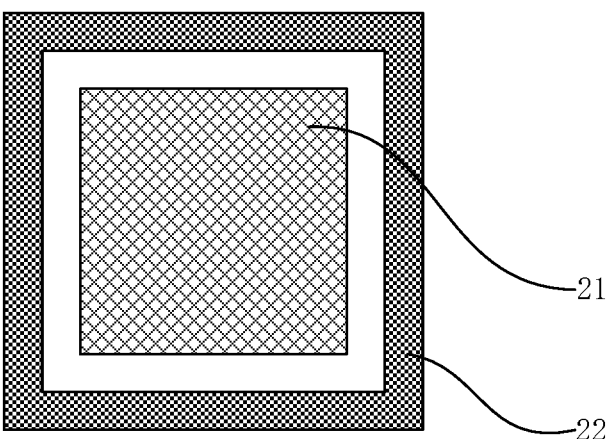
FIG. 17 is a schematic diagram showing projections of a primary light-emitting element and an auxiliary light-emitting element in a display panel according to an embodiment of the present disclosure.
Figure 18:
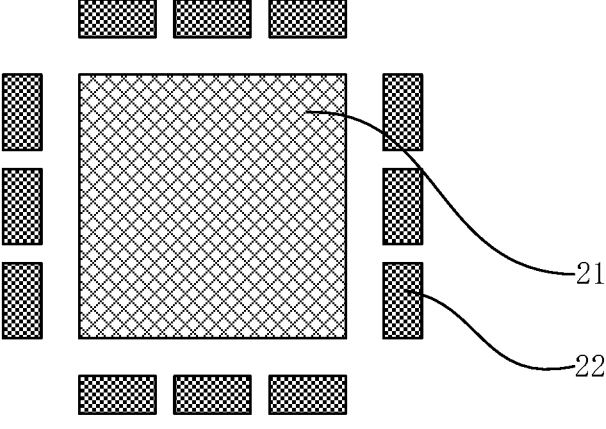
FIG. 18 is a schematic diagram showing projections of a primary light-emitting element and an auxiliary light-emitting element in a display panel according to an embodiment of the present disclosure.

FIG. 17 is a schematic diagram showing projections of a primary light-emitting element and an auxiliary light-emitting element in a display panel according to an embodiment of the present disclosure. FIG. 18 is a schematic diagram showing projections of a primary light-emitting element and an auxiliary light-emitting element in a display panel according to an embodiment of the present disclosure.

In one embodiment of the present disclosure, as shown in FIG. 17, the primary light-emitting element 21 is surrounded by the auxiliary light-emitting element 22. A continuous auxiliary light-emitting element 22 surrounding the primary light-emitting element 21 is at the periphery of the primary light-emitting element 21. That is, the auxiliary light-emitting element 22 at the periphery of the primary light-emitting element 21 is a ring-shaped structure surrounding the primary light-emitting element 21.

In one embodiment of the present disclosure, as shown in FIG. 18, multiple auxiliary light-emitting elements 22 are arranged around the primary light-emitting element 21. Multiple auxiliary light-emitting elements 22 are arranged at a periphery of the primary light-emitting element 21 and spaced from one another, and an arrangement route of at least part of the multiple auxiliary light-emitting elements 22 surrounds the primary light-emitting element 21. That is, the arrangement route of multiple auxiliary light-emitting elements 22 that are arranged at the periphery of the primary light-emitting element 21 and are spaced from one another is a ring-shaped structure surrounding the primary light-emitting element 21.

When the auxiliary light-emitting element 22 surrounds the primary light-emitting element 21 or multiple auxiliary light-emitting elements 22 are arranged surrounding the primary light-emitting element 21, the auxiliary light-emitting element 22 is arranged at various sides of the primary light-emitting element 21. With such configuration, when the display panel 001 is in the anti-peering mode, the viewer basically can see the interfering light emitted by the auxiliary light-emitting elements 22 at the large viewing angle from various directions of the display panel 001. That is, the display panel 001 can basically achieve the 360° anti-peering effect.

Figures 19, 20:
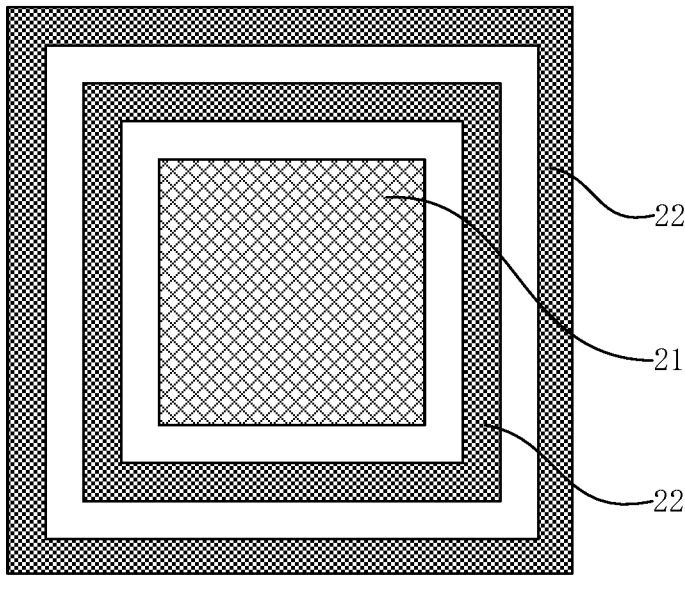
FIG. 19 is a schematic diagram showing projections of a primary light-emitting element and an auxiliary light-emitting element in a display panel according to an embodiment of the present disclosure.
FIG. 20 is a schematic diagram showing projections of a primary light-emitting element and an auxiliary light-emitting element in a display panel according to an embodiment of the present disclosure.

FIG. 19 is a schematic diagram showing projections of a primary light-emitting element and an auxiliary light-emitting element in a display panel according to an embodiment of the present disclosure. FIG. 20 is a schematic diagram showing projections of a primary light-emitting element and an auxiliary light-emitting element in a display panel according to an embodiment of the present disclosure.

In one embodiment of the present disclosure, as shown in FIG. 19 and FIG. 20, the periphery of the primary light-emitting element 21 is provided with at least two auxiliary light-emitting elements 22, and the at least two auxiliary light-emitting elements 22 have different distances to the primary light-emitting element 21.

In this embodiment, as shown in FIG. 19, in a case that the auxiliary light-emitting element 22 surrounds the primary light-emitting element 21, the periphery of the primary light-emitting element 21 may be provided with multiple ring-shaped auxiliary light-emitting elements 22 that are nested.

In this embodiment, as shown in FIG. 20, in a case that multiple auxiliary light-emitting elements 22 are arranged at a periphery of the primary light-emitting element 21, an arrangement route of the multiple auxiliary light-emitting elements 22 at the periphery of the primary light-emitting element 21 are of ring-shaped structures that are nested.

The multiple auxiliary light-emitting elements 22 at the periphery of the primary light-emitting element 21 have different distances to the primary light-emitting element 21, such that the viewer can see the interfering light with a greater intensity at the large angle from various directions, thereby effectively improving the anti-peering effect.

In one embodiment, among at least two auxiliary light-emitting elements 22 that are arranged at the periphery of the primary light-emitting element 21 and have different distances to the primary light-emitting element 21, the auxiliary light-emitting element 22 having a greater distance to the primary light-emitting element 21 has greater brightness. Such configuration can compensate the greater loss of the light that is emitted by the auxiliary light-emitting element 22 having a greater distance to the primary light-emitting element 21 and exits though the first opening 32 above the primary light-emitting element 21.

Figure 21:
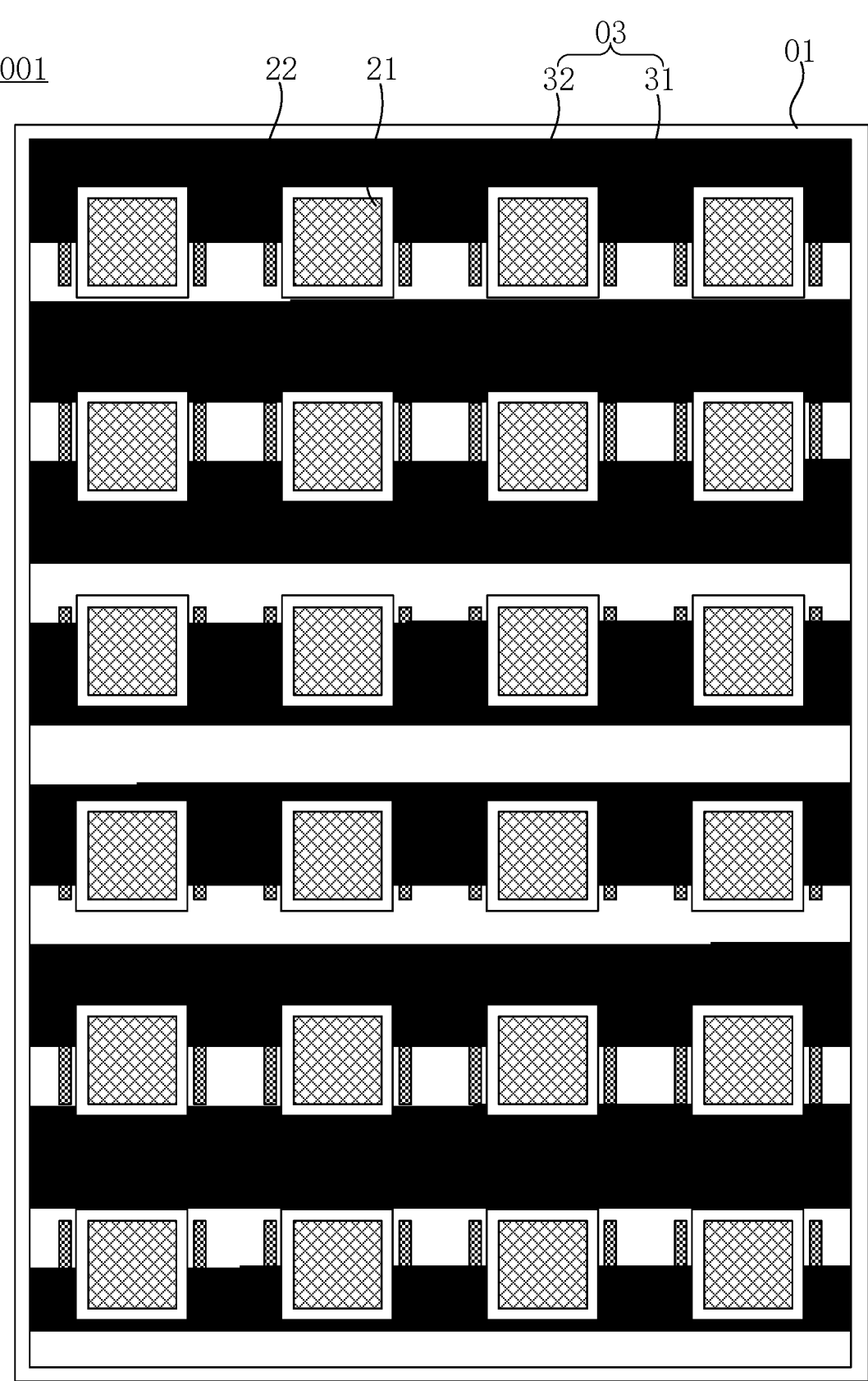
FIG. 21 is a schematic diagram showing a projection of a display panel according to an embodiment of the present disclosure.
Figure 22:
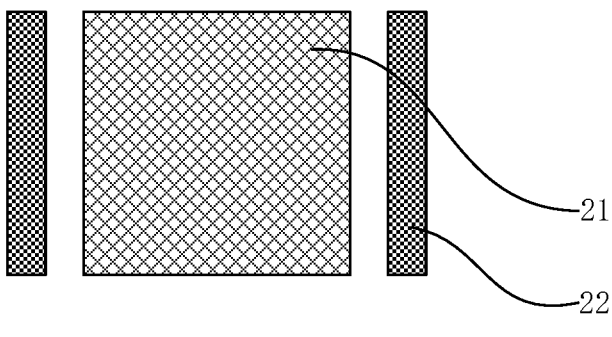
FIG. 22 is a schematic diagram showing projections of a primary light-emitting element and an auxiliary light-emitting element in the display panel shown in FIG. 21.

FIG. 21 is a schematic diagram showing a projection of a display panel according to an embodiment of the present disclosure. FIG. 22 is a schematic diagram showing projections of a primary light-emitting element and an auxiliary light-emitting element in the display panel shown in FIG. 21.

In one embodiment of the present disclosure, as shown in FIG. 21 and FIG. 22, the auxiliary light-emitting elements 22 are arranged at two opposite sides of the primary light-emitting element 21. For example, as shown in FIG. 21 and FIG. 22, the auxiliary light-emitting elements 22 are located at a left side and a right side of the primary light-emitting element 21. When the display panel 001 is in the anti-peering mode, the viewer basically can see the interfering light emitted by the auxiliary light-emitting elements 22 at a large viewing angle at the left side and the right side of the display panel 001. That is, the display panel 001 can achieve the anti-peering effect at the lift side and the right side. Furthermore, the auxiliary light-emitting elements 22 may be arranged at an upper side and a lower side of the display panel 001. In this case, the display panel 001 can achieve the anti-peering effect at the upper side and the lower side.

Figure 23:
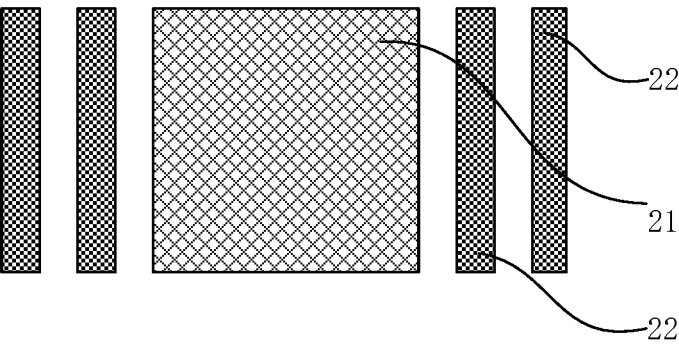
FIG. 23 is a schematic diagram showing projections of a primary light-emitting element and an auxiliary light-emitting element in a display panel according to an embodiment of the present disclosure.

FIG. 23 is a schematic diagram showing projections of a primary light-emitting element and an auxiliary light-emitting element in a display panel according to an embodiment of the present disclosure.

In one embodiment of the present disclosure, as shown in FIG. 23, the periphery of the primary light-emitting element 21 is provided with at least two auxiliary light-emitting elements 22 having different distances to the primary light-emitting element 21. As shown in FIG. 23, the left side of the primary light-emitting element 21 is provided with two auxiliary light-emitting elements 22 having different distances to the primary light-emitting element 21, and the right side of the primary light-emitting element 21 is also provided with two auxiliary light-emitting elements 22 having different distances to the primary light-emitting element 21.

Multiple auxiliary light-emitting elements 22 are provided at the periphery of the primary light-emitting element 21 and have different distances to the primary light-emitting element 21, such that the viewer can see the interfering light with a greater intensity at a large angle from various directions, thereby effectively improving the anti-peering effect.

In addition, in one embodiment, one side of the primary light-emitting element 21 is provided with multiple auxiliary light-emitting elements 22 having a same distance to the primary light-emitting element 21. That is, multiple auxiliary light-emitting elements 22 that are spaced from one another and have a same distance to the primary light-emitting element 21 are arranged at a same side of the primary light-emitting element 21.

Figure 24:
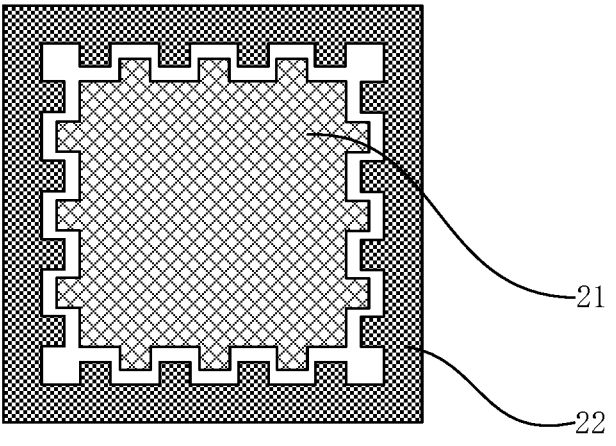
FIG. 24 is a schematic diagram showing projections of a primary light-emitting element and an auxiliary light-emitting element in a display panel according to an embodiment of the present disclosure.

FIG. 24 is a schematic diagram showing projections of a primary light-emitting element and an auxiliary light-emitting element in a display panel according to an embodiment of the present disclosure.

In one embodiment of the present disclosure, as shown in FIG. 24, an edge of the primary light-emitting element 21 close to the auxiliary light-emitting element 22 includes a first convex-concave structure, and an edge of the auxiliary light-emitting element 22 close to the primary light-emitting element 21 has a second convex-concave structure. As the viewing angle of the viewer gradually increases, the intensity of the large-exiting-angle light emitted by the edge of the primary light-emitting element 21 close to the auxiliary light-emitting element 22 gradually decreases, and the intensity of the large-exiting-angle light emitted by the edge of the auxiliary light-emitting element 22 close to the primary light-emitting element 21 gradually increases, thereby avoiding a sudden change in brightness due to the viewing angle change when the viewer views the display panel at a large viewing angle.

Furthermore, as shown in FIG. 24, a concave part of the first convex-concave structure surrounds a convex part of the second convex-concave structure, and a concave part of the second convex-concave structure surrounds a convex part of the first convex-concave structure. It can be understood that the adjacent edges of the primary light-emitting element 21 and the auxiliary light-emitting element 22 are parallel to each other, and the concave parts and convex parts of the adjacent edges match each other. That is, the edge of the primary light-emitting element 21 close to the auxiliary light-emitting element 22 is a curved-line structure or a broken-line structure; and the auxiliary light-emitting element 22 at the periphery of the primary light-emitting element 21 has an edge close to the primary light-emitting element 21, and an extension path of this edge is parallel to an extension path of the edge of the primary light-emitting element 21 close to the auxiliary light-emitting element 22.

In this way, a light-emitting position of the primary light-emitting element 21 and a light-emitting position of the auxiliary light-emitting element 22 at the periphery of the primary light-emitting element 21 may not change suddenly. For example, as shown in FIG. 24, as an area of the left-side light-emitting position of the primary light-emitting element 21 decreases, an area of the right-side light-emitting position of the auxiliary light-emitting element 22 increases. In this way, the sudden change in brightness due to the viewing angle change when the viewer views the display panel at a large viewing angle can be further avoided.

As shown in FIG. 24, a contour of the concave part of the first convex-concave structure may be the same as a contour of the convex part of the second convex-concave structure, and a contour of the concave part of the second convex-concave structure may be the same as a contour of the convex part of the first convex-concave structure. For example, as shown in FIG. 24, the contour of the concave part of the first convex-concave structure and the contour of the convex part of the second convex-concave structure may each be a rectangle, and the contour of the convex part of the first convex-concave structure and the contour of the concave part of the second convex-concave structure may each be a rectangle. In some embodiments, the contour of the concave part of the first convex-concave structure and the contour of the convex part of the second convex-concave structure may each be at least one of a triangle, a trapezoid, or a semicircle; and the contour of the convex part of the first convex-concave structure and the contour of the concave part of the second convex-concave structure may each be at least one of a triangle, a trapezoid, or a semicircle.

Figure 25:
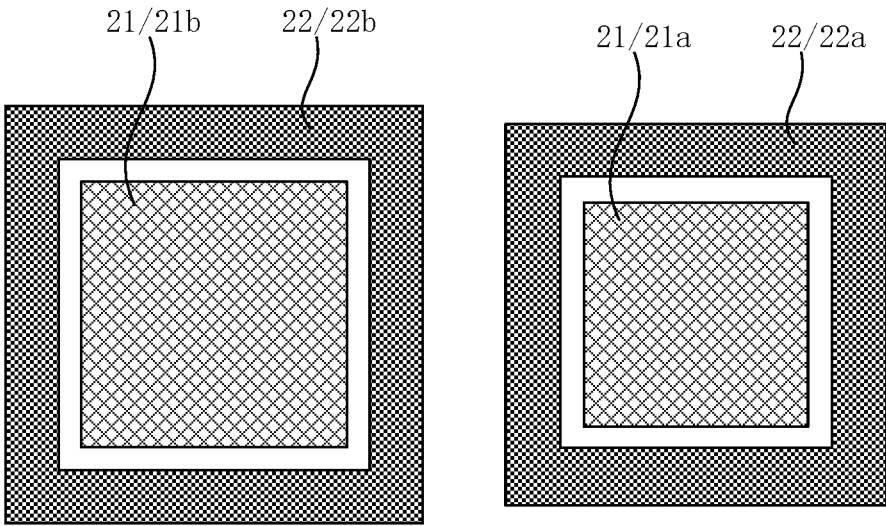
FIG. 25 is a schematic diagram showing projections of a primary light-emitting element and an auxiliary light-emitting element in a display panel according to an embodiment of the present disclosure.

FIG. 25 is a schematic diagram showing projections of a primary light-emitting element and an auxiliary light-emitting element in a display panel according to an embodiment of the present disclosure.

In one embodiment, as shown in FIG. 25, the plurality of primary light-emitting elements 21 may include: a first primary light-emitting element 21*a* and a second primary light-emitting element 21*b*, and an area of the second primary light-emitting element 21*b* is greater than an area of the first primary light-emitting element 21*a*. In this case, in an embodiment of the present disclosure, an area of the auxiliary light-emitting element 22 at the periphery of the second primary light-emitting element 21*b* is greater than an area of the auxiliary light-emitting element 22 at the periphery of the first primary light-emitting element 21*a*.

For example, as shown in FIG. 25, at least one auxiliary light-emitting element 22 at the periphery of the first primary light-emitting element 21*a* is referred to as a first auxiliary light-emitting element 22*a*, and at least one auxiliary light-emitting element 22 at the periphery of the second primary light-emitting element 21*b* is referred to as a second auxiliary light-emitting element 22*b*. The area of the second primary light-emitting element 21*b* is greater than the area of the first primary light-emitting element 21*a*, and the area of the second auxiliary light-emitting element 22*b* is greater than that of the first auxiliary light-emitting element 22*a*.

In this embodiment, for the primary light-emitting element 21 with a larger area, the area of the auxiliary light-emitting element 22 at the periphery of the primary light-emitting element 21 is set to be larger, thereby ensuring the interfering effect of the light emitted by the auxiliary light-emitting element 22.

In this embodiment, the plurality of primary light-emitting elements 21 may include: a red primary light-emitting element, a blue primary light-emitting element, and a green primary light-emitting element. The primary light-emitting element 21 may include an organic light-emitting layer. Then, considering factors such as the light-emitting efficiencies of organic light-emitting layers corresponding to different colors and the sensitivity of the human eye to different colors, typically, the area of the blue primary light-emitting element is greater than the area of the green primary light-emitting element, and the area of the green primary light-emitting element is greater than the area of the red primary light-emitting element. In this case, for any two of the red primary light-emitting element, the blue primary light-emitting element, and the green primary light-emitting element, one with a larger area may be regarded as the first primary light-emitting element 21a, and one with a smaller area may be regarded as the second primary light-emitting element 21b.

Figure 26:
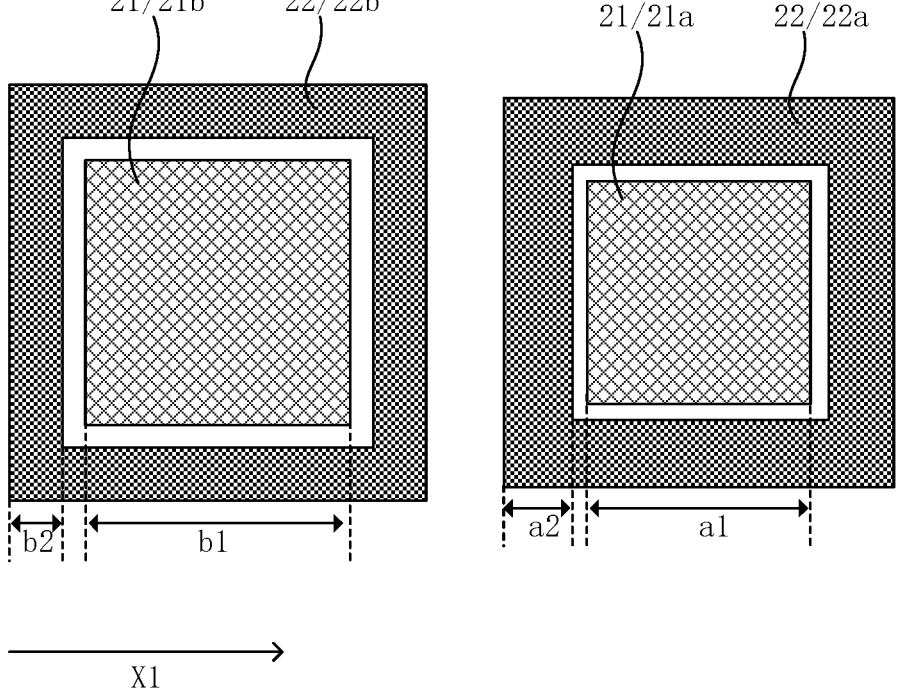
FIG. 26 is a schematic diagram showing projections of a primary light-emitting element and an auxiliary light-emitting element in a display panel according to an embodiment of the present disclosure.

FIG. 26 is a schematic diagram showing projections of a primary light-emitting element and an auxiliary light-emitting element in a display panel according to an embodiment of the present disclosure.

In one embodiment of the present disclosure, as shown in FIG. 26, the plurality of primary light-emitting elements 21 may include: a first primary light-emitting element 21a and a second primary light-emitting element 21b. A width of the first primary light-emitting element 21a in a first direction X1 is a1, and a width of the second primary light-emitting element 21b in the first direction X1 is b1, where a1<b1. That is, the width of the first primary light-emitting element 21a in the first direction X1 is smaller than the width of the second primary light-emitting element 21b in the first direction X1.

In the first direction X1, a width of the auxiliary light-emitting element 22 at the periphery of the first primary light-emitting element 21a is a2, and a width of the auxiliary light-emitting element 22 at the periphery of the second primary light-emitting element 21b is b2. That is, the width of the first auxiliary light-emitting element 22a in the first direction X1 is a2, and the width of the second auxiliary light-emitting element 22b in the first direction X1 is b2.

In an embodiment of the present disclosure, (a2/a1)>(b2/b1). That is, a ratio of the width of the first auxiliary light-emitting element 22a in the first direction X1 to the width of the first primary light-emitting element 21a in the first direction X1 is greater than a ratio of the width of the second auxiliary light-emitting element 22b in the first direction X1 to the width of the second primary light-emitting element 21b in the first direction X1. That is, a periphery of a primary light-emitting element 21 with a smaller width in the first direction X1 is provided with an auxiliary light-emitting element 22 with a larger width in the first direction X1.

When the width of the primary light-emitting element 21 in the first direction X1 is smaller, the periphery of the primary light-emitting element 21 has a larger space in the first direction X1 for arranging the auxiliary light-emitting element 22. The auxiliary light-emitting element 22 with a larger width in the first direction X1 arranged in this space can provide better interference and anti-peering effects.

It should be noted that the first direction X1 shown in FIG. 22 is a left-right direction, but the first direction X1 may also be an up-down direction or other direction in FIG. 22.

In addition, in one embodiment, the area of the first primary light-emitting element 21a is S1a, and the area of the second primary light-emitting element 21b is S1b, where S1a<S1b. That is, the area of the first primary light-emitting element 21a is smaller than the area of the second primary light-emitting element 21b.

The area of the auxiliary light-emitting element 22 at the periphery of the first primary light-emitting element 21a is S2a, and the area of the auxiliary light-emitting element 22 at the periphery of the second primary light-emitting element 21b is S2b. That is, the area of the first auxiliary light-emitting element 22a is S2a, and the area of the second auxiliary light-emitting element 22b is S2b, where S2a<S2b. That is, the area of the first auxiliary light-emitting element 22a is smaller than the area of the second auxiliary light-emitting element 22b.

In an embodiment of the present disclosure, (S2a/S1a)>(S2b/S1b). That is, a ratio of the area of the first auxiliary light-emitting element 22a to the area of the first primary light-emitting element 21a is greater than a ratio of the area of the second auxiliary light-emitting element 22b to the area of the second primary light-emitting element 21b. That is, although a primary light-emitting element 21 having a smaller area is provided with an auxiliary light-emitting element 22 having a smaller area at the periphery of the primary light-emitting element 21, the ratio of the area of the auxiliary light-emitting element 22 having a smaller area to the area of the primary light-emitting element 21 having a smaller area is larger.

When the area of the primary light-emitting element 21 is smaller, the periphery of the primary light-emitting element 21 has a larger space for arranging the auxiliary light-emitting element 22. The auxiliary light-emitting element 22 that has a relatively increased area being arranged in this space can provide better interference and anti-peering effects.

Figure 27:
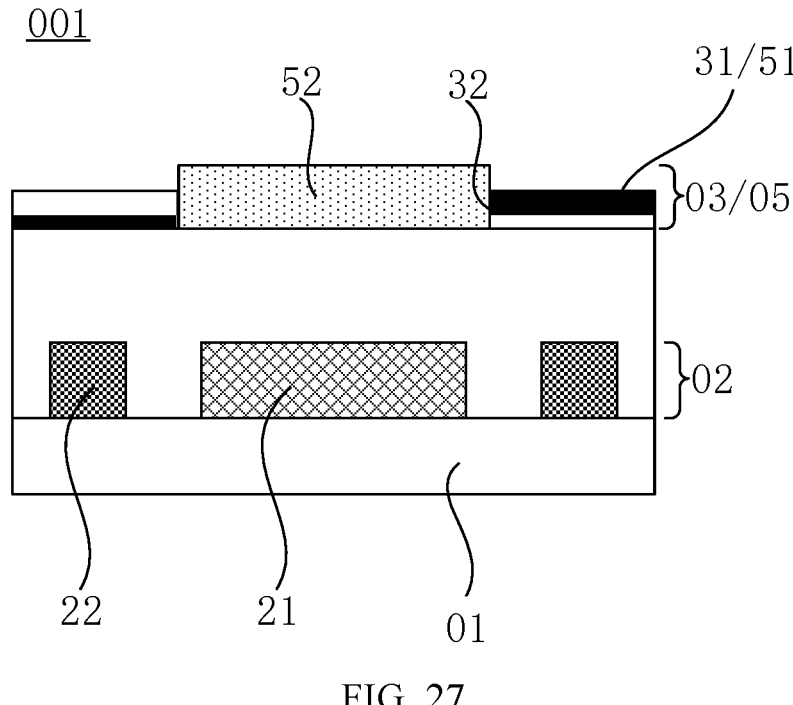
FIG. 27 is a schematic diagram showing a light-emitting element and a color filter layer in a display panel according to an embodiment of the present disclosure.

FIG. 27 is a schematic diagram showing a light-emitting element and a color filter layer in a display panel according to an embodiment of the present disclosure.

In one embodiment of the present disclosure, as shown in FIG. 27, the display panel 001 further includes a color filter layer 05, and the color filter layer 05 is arranged at a side of the light-emitting element layer 02 facing away from the substrate 01. The color filter layer 05 includes a black matrix 51 and a primary color resist 52, and the primary color resist 51 fills an opening of the black matrix 51.

As shown in FIG. 27, the light-shielding part 31 of the light-shielding layer 03 is reused as the black matrix 51, and the first opening 32 is filled with the primary color resist 52.

It should be noted that in the manufacturing process of the color filter layer 05, the black matrix 51 is typically formed firstly, and then the color resist is formed. Taking process errors into account, the area of the color resist is generally greater than the area of the opening filled by the color resist. Therefore, in addition to the opening, the color resist also exists outside the opening and is continuous with the primary color resist 52. Since the color resist outside the opening overlaps with the black matrix 51 to be opaque, the color resist involved in the present disclosure specifically refers to the color resist filling the opening. Accordingly, the expression that the first opening 32 is filled with the primary color resist 52 does not exclude that the color resist exists outside the first opening 32 and is connected to the primary color resist 52. However, this color resist can be omitted because the black matrix 51 overlapping with this color resist is opaque.

Since at least part of the primary light-emitting element 21 is exposed by the first opening 32, the primary color resist 52 covers at least part of the primary light-emitting element 21, and the light emitted by the primary light-emitting element 21 becomes light with purer chromaticity after traveling through the primary color resist 52.

Figure 28:
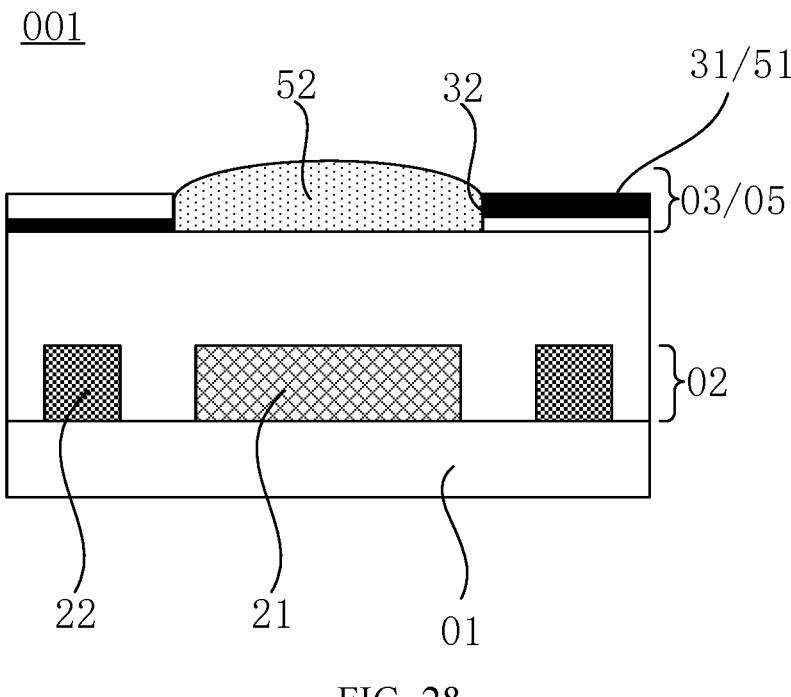
FIG. 28 is a schematic diagram showing a light-emitting element and a color filter layer in a display panel according to an embodiment of the present disclosure.

FIG. 28 is a schematic diagram showing a light-emitting element and a color filter layer in a display panel according to an embodiment of the present disclosure.

In one embodiment of the present disclosure, as shown in FIG. 28, a thickness of a part of the primary color resist 52 close to the auxiliary light-emitting element 22 is smaller than a thickness of a center part of the primary color resist 52. That is, the primary color resist 52 is a structure with a thick center and a thin edge. That is, a thinning process is applied to the edge part of the primary color resist 52.

The interfering light that needs to be seen is emitted by the auxiliary light-emitting element 22 and exits through the first opening 32. At least part of the interfering light enters the first opening 32 at a large incident angle and exits by mainly traveling through the edge part of the primary color resist 52. By thinning the edge part of the primary color resist 52, the intensity of the interfering light that is emitted by the auxiliary light-emitting element 22 and exits through the edge part of the primary color resist 52 can be increased, thereby improving the interfering effect.

In one embodiment of the present disclosure, as shown in FIG. 1 and FIG. 21, the light-shielding part 31 between adjacent first openings 32 is a continuous structure. That is, the light-shielding part 31 between adjacently first openings 32 no longer has a hollowed part. It should be noted that the light-shielding part 31 between adjacent first openings 32 may have a through-hole for achieving electrical connection between an upper electrical structure and a lower electrical structure, but the light-shielding part 31 no longer has a hollowed part for arranging the color resist.

That is, in this embodiment, the interfering light emitted by the auxiliary light-emitting element 22 exits through the first opening 32. In an example, as shown in FIG. 1, the interfering light emitted by the auxiliary light-emitting element 22 at the left side of the primary light-emitting element 21 is transmitted towards an upper-right direction and exits from the first opening 32 above the primary light-emitting element 21, and the interfering light emitted by the auxiliary light-emitting element 22 at the right side of the primary light-emitting element 21 is transmitted towards an upper-left direction and exits from the first opening 32 above the primary light-emitting element 21.

In this embodiment, the first opening 32 is reused as an opening though which the interfering light emitted by the auxiliary light-emitting element 22 exits, so there is no need to provide an additional hollowed part in the light-shielding layer 03 for exiting of the interfering light emitted by the auxiliary light-emitting element 22, thereby avoiding increasing of the reflectivity of the display panel 001 due to too many openings in the light-shielding layer 03.

In one embodiment, as shown in FIG. 1 and FIG. 21, the first opening 32 covers the primary light-emitting element 21. That is, the primary light-emitting element 21 is completely exposed by the first opening 32. With the configuration in which the primary light-emitting element 21 is completely exposed by the first opening 32, on the one hand, the light-exiting amount of the primary light-emitting element 21 is increased, and the brightness of the display panel 001 is increased; and on the other hand, the light-exiting amount of the auxiliary light-emitting element 22 can be increased due to the increased area of the first opening 32, thereby increasing the interfering effect of the auxiliary light-emitting element 22.

Furthermore, as shown in FIG. 1 and FIG. 21, in the direction perpendicular to the plane of the display panel 001, the area of the projection of the primary light-emitting element 21 on the plane of the display panel 001 is greater than the area of the projection of the corresponding first opening 32. That is, the first opening 32 at a light-exiting side of the primary light-emitting element 21 not only covers the primary light-emitting element 21, but also covers a part of the periphery region of the primary light-emitting element 21.

By further increasing the area of the first opening 32, the light-exiting amount of the interfering light emitted by the auxiliary light-emitting element 22 is ensured, the interfering brightness of the interfering light is increased, and thus the anti-peering effect of the display panel 001 is effectively improved.

In this embodiment, the area of the first opening 32 is increased in order to ensure the light-exiting amount of the auxiliary light-emitting element 22. However, in a plane parallel to the plane of the display panel 001, a distance between the projection of the auxiliary light-emitting element 22 and the edge of the projection of the first opening 32 may still be greater than 0, so as to avoid the auxiliary light-emitting element 22 from affecting the normal display of the display panel 001.

In this embodiment, since the light emitted by the primary light-emitting element 21 and the light emitted by its peripheral auxiliary light-emitting element 22 in the anti-peering mode both exit through a same first opening 32, the light emitted by the primary light-emitting element 21 and the light emitted by its peripheral auxiliary light-emitting element 22 are both filtered by a same primary color resist 52 to exit. Therefore, the light emitted by the primary light-emitting element 21 and the light emitted by its peripheral auxiliary light-emitting element 22 are of a same color, so as to ensure that the light emitted by the primary light-emitting element 21 and the light emitted by its peripheral auxiliary light-emitting element 22 can pass the primary color resist 52 of a same color.

In addition, the primary color resist 52 may be of a structure with a thick center and a thin edge as shown in FIG. 28, the details are not repeated herein.

Figure 29:
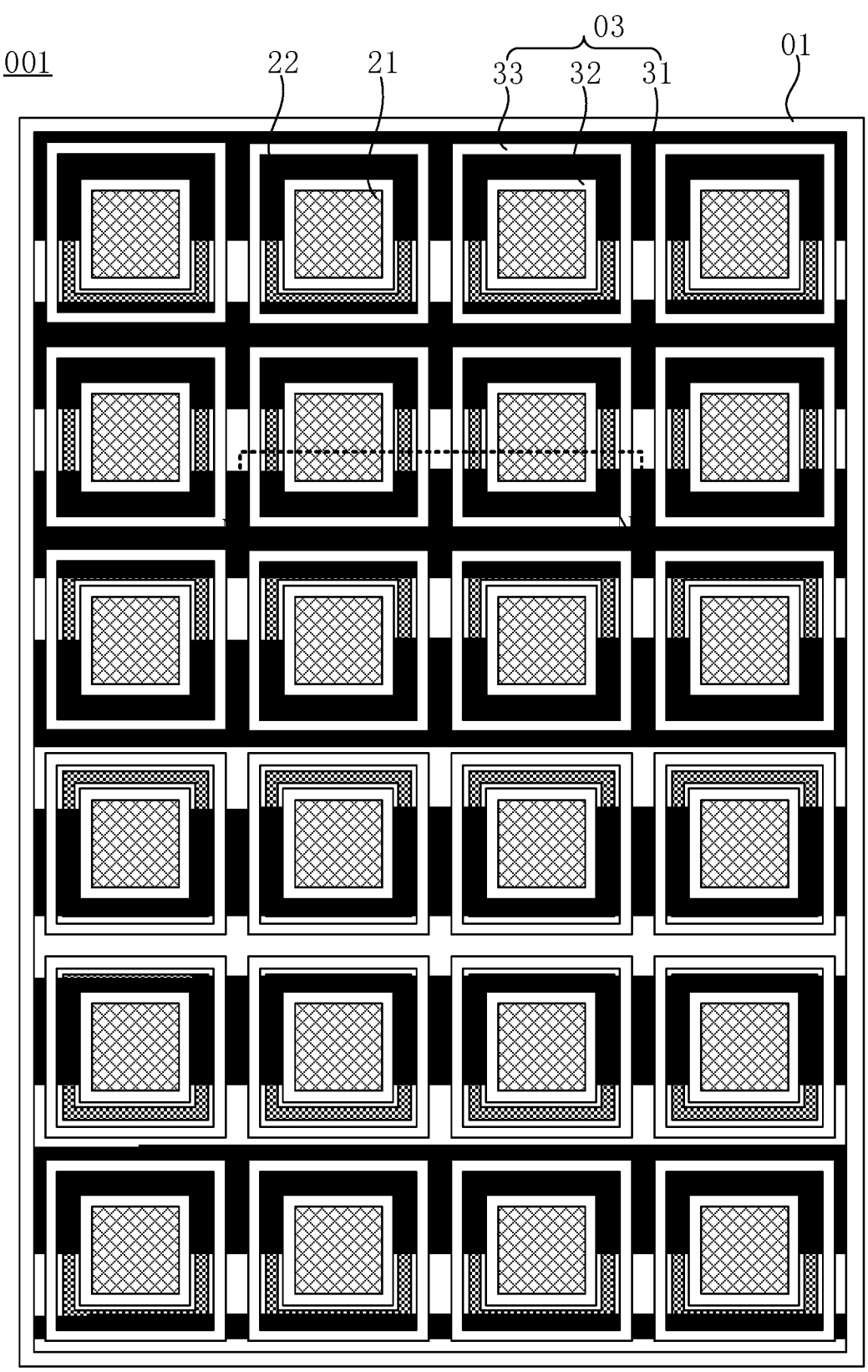
FIG. 29 is a schematic diagram showing a display panel according to an embodiment of the present disclosure.
Figure 30:
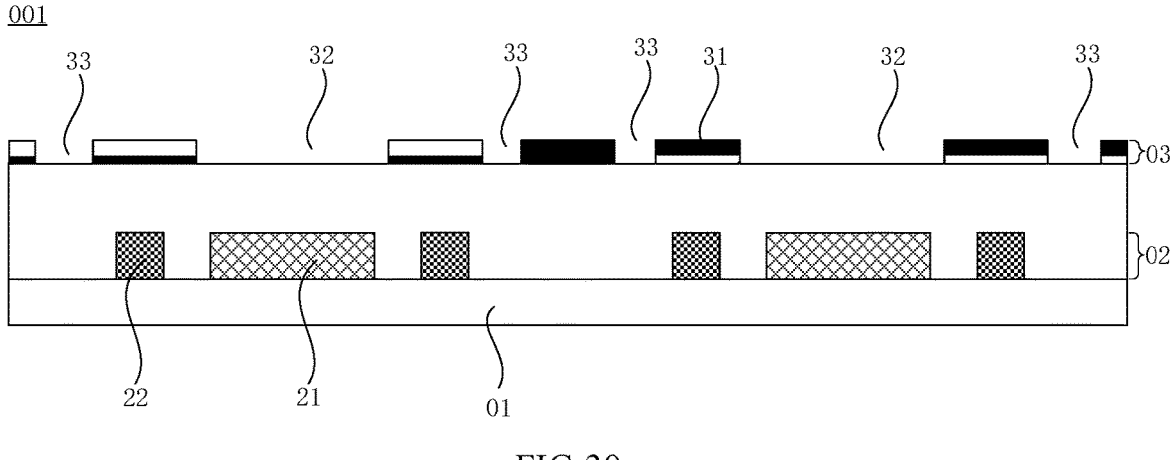
FIG. 30 is a sectional view of the display panel taken along N1-N2 shown in FIG. 29.

FIG. 29 is a schematic diagram showing a display panel according to an embodiment of the present disclosure. FIG. 30 is a sectional view of the display panel taken along N1-N2 shown in FIG. 29.

In one embodiment of the present disclosure, as shown in FIG. 29 and FIG. 30, the light-shielding layer 03 further includes a second opening 33, and the second opening 33 is arranged at a periphery of the first opening 32. That is, the light-shielding layer 03 includes a plurality of hollowed parts, at least one of the plurality of hollowed parts is the first opening 21, and another at least one of the plurality of hollowed parts is the second opening 33.

The corresponding relationship between the second opening 33 and the first opening 32 may be the same as the corresponding relationship between the primary light-emitting element 21 and the auxiliary light-emitting element 22. For example, if the periphery of the primary light-emitting element 21 is provided with the auxiliary light-emitting element 22 that surrounds the primary light-emitting element 21, then the periphery of first opening 32 is provided with the second opening 33 that surrounds the first opening 32. For example, if two opposite sides of the primary light-emitting element 21 each are provided with the auxiliary light-emitting element 22 adjacent to the primary light-emitting element 21, then two opposite sides of the first opening 32 each are provided with the second opening 33 adjacent to the first opening 32. The second opening 33 is mainly configured to transmit the interfering light emitted by the auxiliary light-emitting element 22.

It should be noted that, although the light-shielding layer 03 includes the second opening 33, the auxiliary light-emitting element 22 is still covered by the light-shielding layer 03. That is, the second opening 33 does not overlap with the auxiliary light-emitting element 22. Such configuration avoids that the interfering light emitted by the auxiliary light-emitting element 22 is seen by the viewer at a small viewing angle or a frontal viewing angle when both the primary light-emitting element 21 and the auxiliary light-emitting element 22 emit light in the anti-peering mode.

Figure 31:
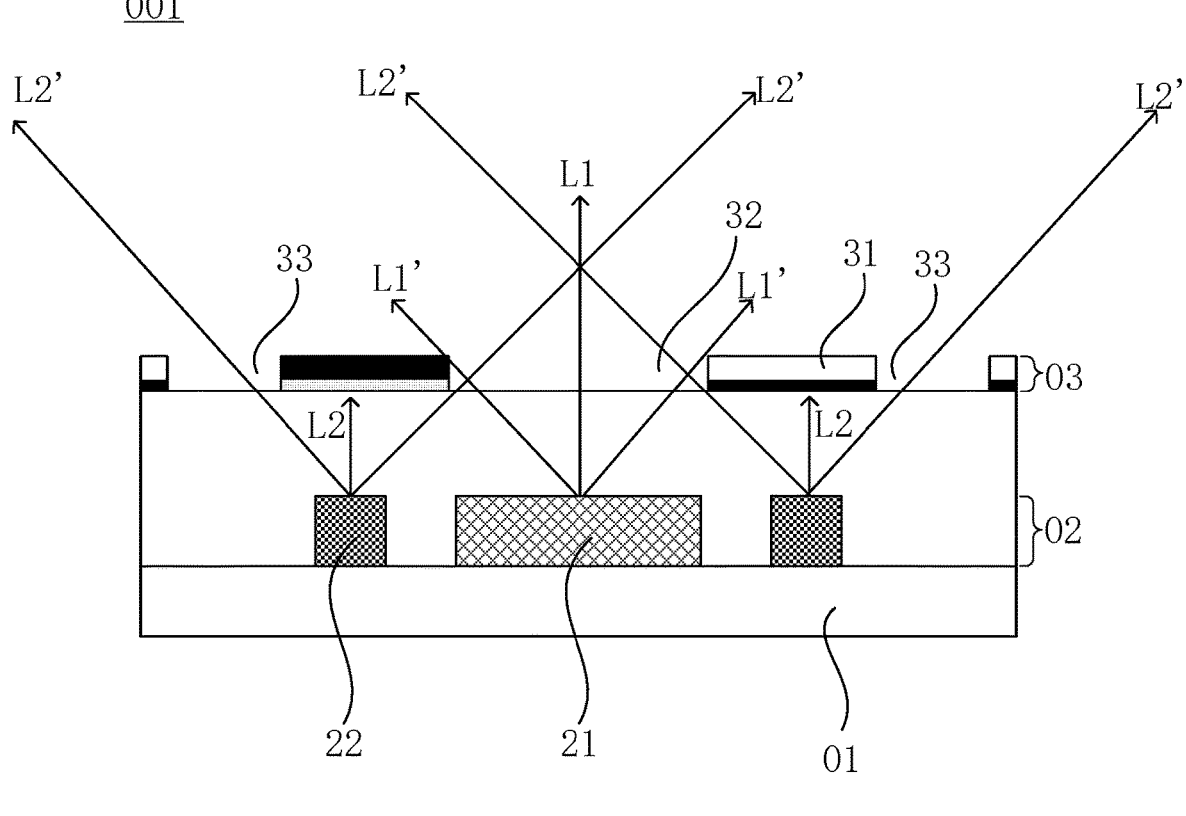
FIG. 31 is a schematic diagram showing light paths of a display panel in an anti-peering mode according to an embodiment of the present disclosure.
Figures 32, 33:
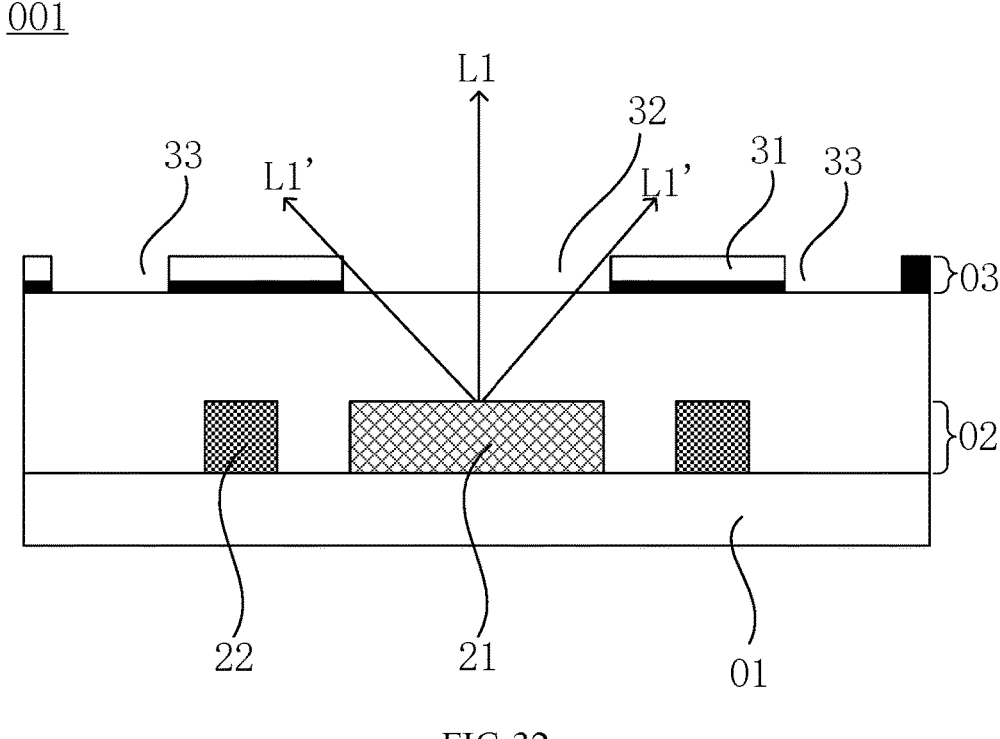
FIG. 32 is a schematic diagram showing light paths of a display panel in a normal mode according to an embodiment of the present disclosure.
FIG. 33 is a schematic diagram showing projections of a light-emitting element and a light-shielding layer according to an embodiment of the present disclosure.

FIG. 31 is a schematic diagram showing light paths of a display panel in an anti-peering mode according to an embodiment of the present disclosure. FIG. 32 is a schematic diagram showing light paths of a display panel in a normal mode according to an embodiment of the present disclosure.

As shown in FIG. 31, when both the primary light-emitting element 21 and the auxiliary light-emitting element 22 emit light in the anti-peering mode (that is, when the display mode of the display panel is the anti-peering mode), if the viewer views the display panel at a frontal viewing angle or a small viewing angle, the small-exiting-angle light L1 emitted by the primary light-emitting element 21 can travel through the first opening 32 in the light-shielding layer 03 and be seen by the viewer, but the small-exiting-angle light L2 emitted by the auxiliary light-emitting element 22 is shielded by the light-shieling part 31 of the light-shielding layer 03 and cannot be seen by the viewer; and if the viewer views the display panel at a large viewing angle, the large-exiting-angle light L1' emitted by the primary light-emitting element 21 can travel through the first opening 32 in the light-shielding layer 03 and be seen by the viewer, and the large-exiting-angle light L2' emitted by the auxiliary light-emitting element 22 can also travel the first opening 31 and/or the second opening 33 and be seen by the viewer. By arranging the second opening 33, the light-exiting amount of the interfering light emitted by the auxiliary light-emitting element 2 is increased, and the interfering effect is improved.

Please refer to FIG. 32, when the primary light-emitting element 21 emits light and the auxiliary light-emitting element 22 does not emit light (that is, the display mode of the display panel is the normal mode), whether the viewer views the display panel at a large viewing angle or a small viewing angle, the viewer can only see the light L1 and light L1' emitted by the primary light-emitting element 21. That is, the viewer can normally see the image displayed by the display panel 001 at various viewing angles.

In one embodiment, as shown in FIG. 29, the primary light-emitting element 21, the auxiliary light-emitting element 22 and the second opening 33 have projections in a direction perpendicular to the plane of the display panel 001, the projection of second opening 33 is located at a side of the projection of the auxiliary light-emitting element 22 facing away from the projection of the primary light-emitting element 21. That is, as shown in FIG. 30 to FIG. 32, the second opening 33 is located at a side of a region corresponding to the auxiliary light-emitting element 22 facing away from a region corresponding to the primary light-emitting element 21.

The second opening 33 is provided at a side of the auxiliary light-emitting element 22, and the first opening 32 is provided at another side of the auxiliary light-emitting element 22. For example, as shown in FIG. 31 and FIG. 32, one of the first opening 32 and the second opening 33 is provided at an upper-left side of the auxiliary light-emitting element 22, and the other one of the first opening 32 and the second opening 33 is provided at an upper-right side of the auxiliary light-emitting element 22.

In this embodiment, as described above, in order to prevent the interfering light emitted by the auxiliary light-emitting element 22 from being seen by the viewer at a small viewing angle, the auxiliary light-emitting element 22 does not overlap with the second opening 33. In this embodiment, the second opening 33 is arranged at a side of the auxiliary light-emitting element 22 facing away from the primary light-shielding element 21. Then, a distance between the auxiliary light-emitting element 22 and the primary light-shielding element 21 can be relatively small, and the pixel density of the display panel 001 can be increased.

FIG. 33 is a schematic diagram showing projections of a light-emitting element and a light-shielding layer according to an embodiment of the present disclosure.

In addition, the second opening 33 is arranged at a side of the auxiliary light-emitting element 22 facing away from the primary light-shielding element 21. If the second opening 33 between different primary light-shielding elements 21 occupies too much area, the pixel density of the display panel is affected. In order to prevent this, as shown in FIG. 33, adjacent auxiliary light-emitting elements 22 may share the second opening 33. That is, one second opening 33 may be arranged between two auxiliary light-emitting elements 22 and is configured to allow the interfering light emitted by the two auxiliary light-emitting elements 22 to pass through.

As shown in FIG. 33, two auxiliary light-emitting elements 22 that are located at the peripheries of two adjacent primary light-shielding elements 21 may share the second opening 33.

Figure 34:
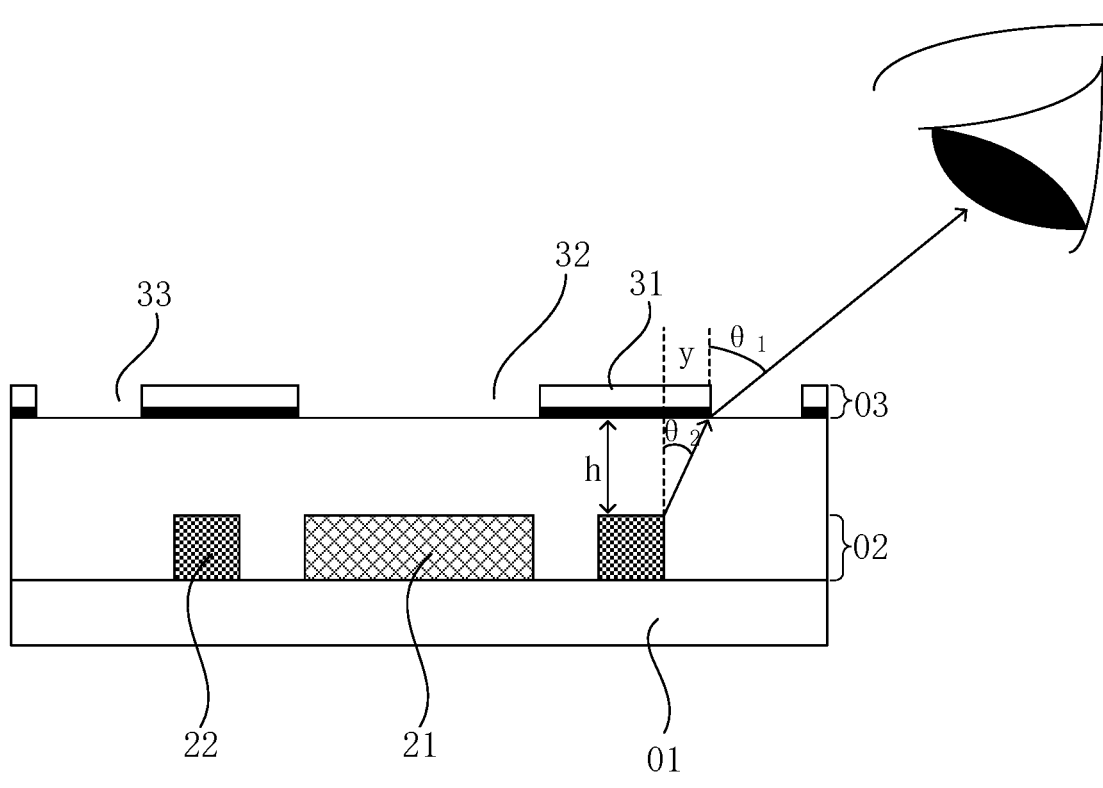
FIG. 34 is a schematic diagram showing a relationship of a light-emitting element and a light-shielding layer according to an embodiment of the present disclosure.

FIG. 34 is a schematic diagram showing a relationship of a light-emitting element and a light-shielding layer according to an embodiment of the present disclosure.

In one embodiment, as shown in FIG. 34, the auxiliary light-emitting element 22 and the corresponding second opening 33 have projections a direction perpendicular to the plane of the display panel 001, and a minimum distance between an edge of the projection of the auxiliary light-emitting element 22 close to the projection of the second opening 33 and an edge of the projection of the second opening 33 close to the projection of the auxiliary light-emitting element 22 is y. As described above, y>0.

In addition, y satisfies:

$$y > \frac{h * n_1 * \sin\theta_1}{\sqrt{n_2^2 - n_1^2 * \sin\theta_1}}$$

herein, $\theta_1$ denotes a minimum anti-peeping angle of the display panel 001, $n_1$ denotes a refractivity of a layer at a side of the light-shielding layer 03 facing away from the light-emitting element layer 02, $n_2$ denotes a refractivity of a layer between the light-shielding layer 03 and the light-emitting element layer 02, and h denotes a minimum distance between the auxiliary light-emitting element 22 and the light-shielding layer 03.

The derivation process of the above-mentioned formula can refer to the derivation process in the embodiment corresponding to FIG. 7, which will not be repeated herein.

Through the above formula, the minimum distance between the projection of the auxiliary light-emitting element 22 and the projection of the second opening 33 can be reasonably designed according to the requirement for the anti-peering angle of the display panel 001.

Figure 35:
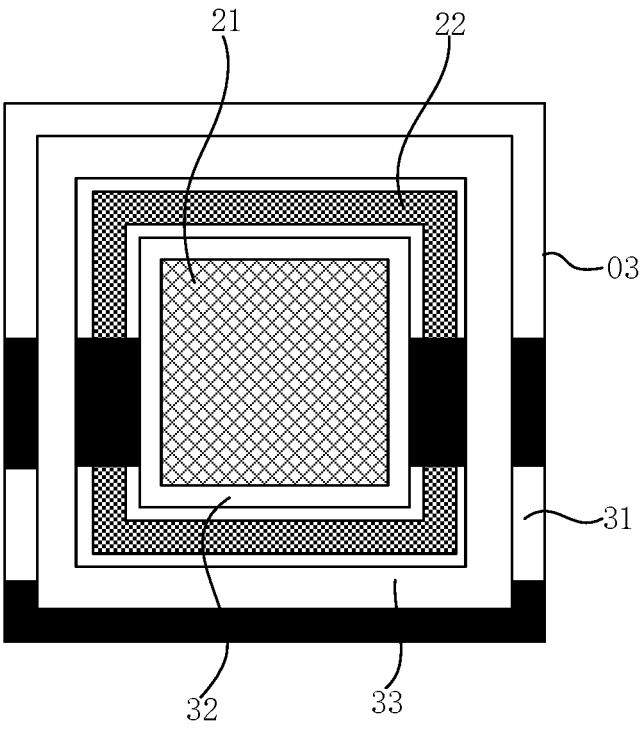
FIG. 35 is a schematic diagram showing projections of a light-emitting element and a light-shielding layer according to an embodiment of the present disclosure.
Figure 36:
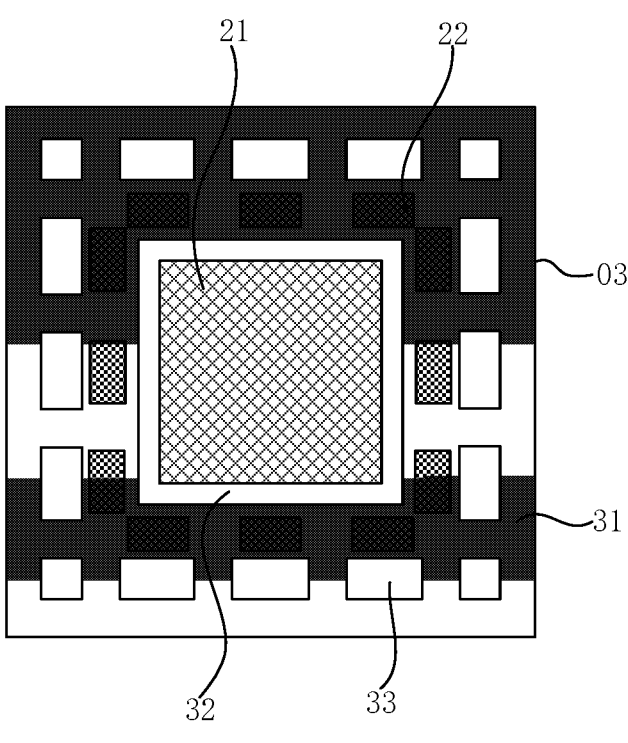
FIG. 36 is a schematic diagram showing projections of a light-emitting element and a light-shielding layer according to an embodiment of the present disclosure.

FIG. 35 is a schematic diagram showing projections of a light-emitting element and a light-shielding layer according to an embodiment of the present disclosure. FIG. 36 is a schematic diagram showing projections of a light-emitting element and a light-shielding layer according to an embodiment of the present disclosure.

In one embodiment, as shown in FIG. 35 and FIG. 36, the auxiliary light-emitting element 22 surrounds the primary light-emitting element 21, and the second opening 33 surrounds the first opening 32.

As shown in FIG. 35, the second opening 33 surrounds the first opening 32, and hence the periphery of the first opening 32 is provided with the second opening 33 that is continuous and surrounds the first opening 32. That is, the second opening 33 at the periphery of the first opening 32 is a ring structure surrounding the first opening 32. The light-transmitting area of the second opening 33 is increased by configuring the second opening 33 as a ring structure.

In addition, as shown in FIG. 35, the auxiliary light-emitting element 22 surrounds the primary light-emitting element 21. In another embodiment, multiple auxiliary light-emitting elements 22 may be arranged surrounding the primary light-emitting element 21.

As shown in FIG. 36, multiple second openings 33 are arranged surrounding the first opening 32. The periphery of the first opening 32 is provided with multiple second openings 33 that are spaced from one another, and at least part of the multiple second openings 33 are arranged in an arrangement route surrounding the first opening 31. That is, the arrangement route of multiple second openings 33 that are located at the periphery of the first opening 32 and spaced from one another is a ring structure surrounding the first opening 32. Multiple second openings 33 in the light-shielding layer 03 are spaced from one another, so the light-shielding part 31 is provided between adjacent second openings 33, and the light-shielding part 31 in the light-shielding layer 03 is a whole-surface-connection structure, which increases the reliability of the light-shielding part 31.

As shown in FIG. 36, multiple auxiliary light-emitting elements 22 are arranged surrounding the primary light-emitting element 21. In another embodiment, the auxiliary light-emitting element 22 surrounds the primary light-emitting element 21.

It should be noted that if the periphery of primary light-emitting element 21 is provided with multiple ring-shaped auxiliary light-emitting elements 22 that are nested or multiple auxiliary light-emitting elements 22 having a ring-shaped arrangement route, the light-shielding layer 03 may include multiple ring-shaped second openings 33 that are nested or multiple second openings 33 having a ring-shaped arrangement route.

In one embodiment, as shown in FIG. 35 and FIG. 36, the primary light-emitting element 21 and the corresponding first opening 32 have projections in a direction perpendicular to the plane of the display panel 001, and the area of the projection of the primary light-emitting element 21 is smaller than the area of the projection of the corresponding first opening 32. By setting the first opening 32 to have a larger area, the light-exiting amount of the interfering light emitted by the auxiliary light-emitting element 22 is ensured, the interfering intensity of the interfering light is improved, thereby effectively improving the anti-peering effect of the display panel 001.

Figure 37:
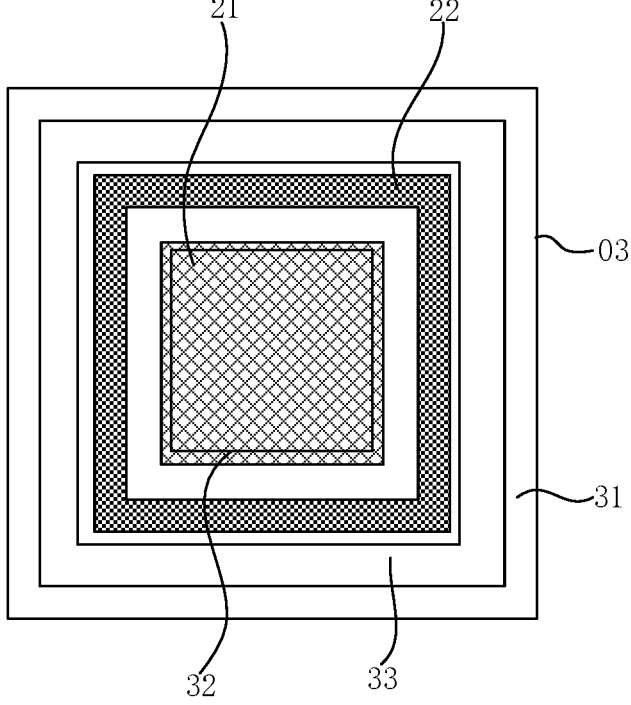
FIG. 37 is a schematic diagram showing projections of a light-emitting element and a light-shielding layer according to an embodiment of the present disclosure.

FIG. 37 is a schematic diagram showing projections of a light-emitting element and a light-shielding layer according to an embodiment of the present disclosure.

In one embodiment, as shown in FIG. 37, the first opening 32 and the primary light-emitting element 21 have projections in a direction perpendicular to the plane of the display panel, the area of the projection of the first opening 32 is smaller than or equal to the area of the projection of the primary light-emitting element 21. That is, the first opening 32 only exposes part of the primary light-emitting element

21. On the one hand, the light-exiting amount of the light that is emitted by the auxiliary light-emitting element 22 and exits though the first opening 32 can be reduced, and a risk that the viewer at a small viewing angle sees the light that is emitted by the auxiliary light-emitting element 22 and exits though the first opening 32 can be reduced. On the other hand, reducing the area of the first opening 32 can reduce the reflection of the external light by the display panel 001.

Figure 38:
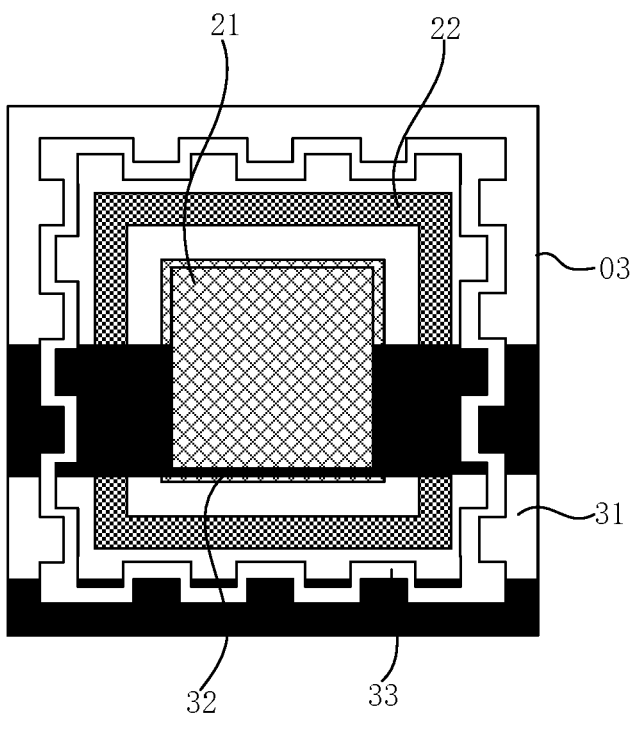
FIG. 38 is a schematic diagram showing projections of a light-emitting element and a light-shielding layer according to an embodiment of the present disclosure.
Figure 39:
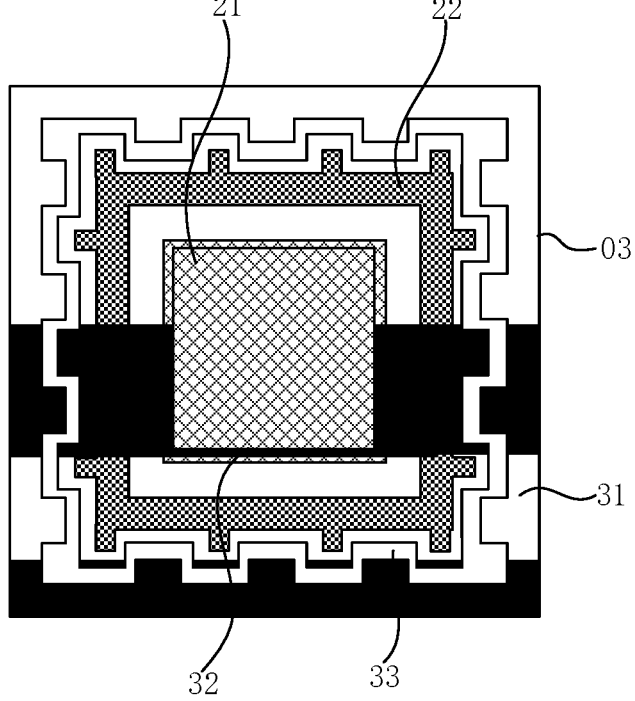
FIG. 39 is a schematic diagram showing projections of a light-emitting element and a light-shielding layer according to an embodiment of the present disclosure.

FIG. 38 is a schematic diagram showing projections of a light-emitting element and a light-shielding layer according to an embodiment of the present disclosure. FIG. 39 is a schematic diagram showing projections of a light-emitting element and a light-shielding layer according to an embodiment of the present disclosure.

In one embodiment, as shown in FIG. 38 and FIG. 39, at least one edge of the second opening 33 includes a third convex-concave structure. Since the second opening 33 is usually an elongated structure, a diffraction phenomenon is prone to occur. The diffraction problem can be alleviated by configuring at least one edge of the second opening 33 as a convex-concave structure.

For example, as shown in FIG. 38 and FIG. 39, two opposite edges of the second opening 33 are both configured as third convex-concave structures. Moreover, the third convex-concave structures at the edges of the second opening 33 are formed by setting edges, that faces the second opening 33 of the light-shielding parts 31 located at two sides of the second opening 33 as convex-concave structures. In addition, the convex-concave structures of the light-shielding parts 31 located at two sides of the second opening may match each other.

A contour of the concave part of the convex part of the third concave-convex structure is at least one of a rectangle, a triangle, a trapezoid, or a semicircle. A contour of the convex part of the third concave-convex structure is at least one of a rectangle, a triangle, a trapezoid, or a semicircle.

In one embodiment, as shown in FIG. 38, the edge of the auxiliary light-emitting element 22 facing the adjacent second opening 33 may be a smooth structure.

In one embodiment, as shown in FIG. 39, the edge of the auxiliary light-emitting element 22 facing the adjacent second opening 33 may be a concave-convex structure.

Figure 40:
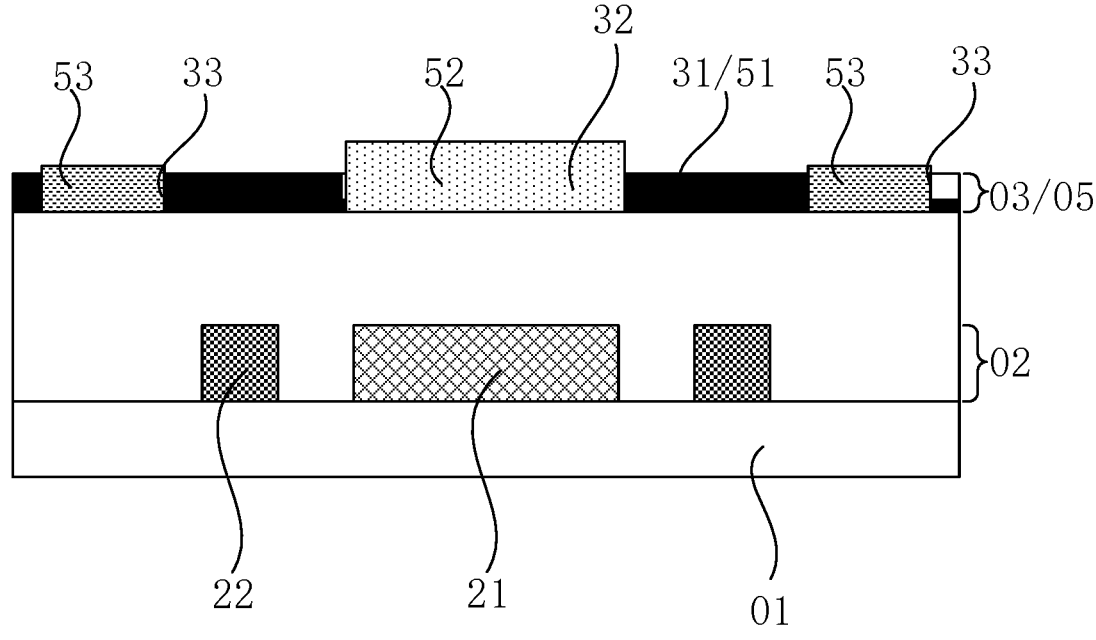
FIG. 40 is a schematic diagram showing a light-emitting element and a color filter layer according to an embodiment of the present disclosure.
Figure 41:
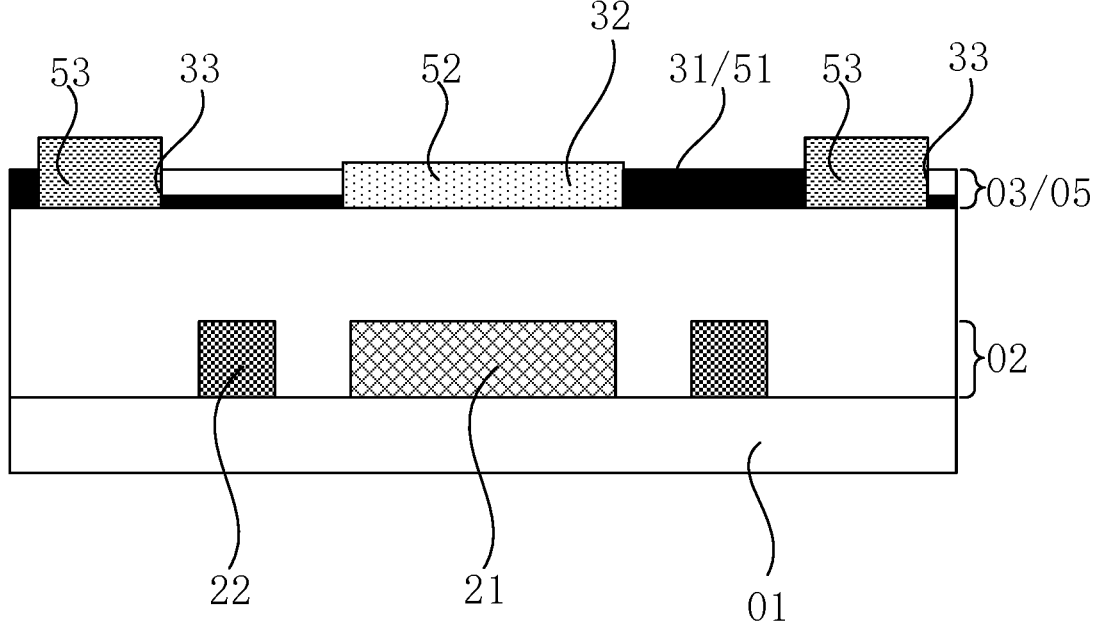
FIG. 41 is a schematic diagram showing a light-emitting element and a color filter layer according to an embodiment of the present disclosure.

FIG. 40 is a schematic diagram showing a light-emitting element and a color filter layer according to an embodiment of the present disclosure. FIG. 41 is a schematic diagram showing a light-emitting element and a color filter layer according to an embodiment of the present disclosure.

In one embodiment, as shown in FIG. 40 and FIG. 41, the display panel 001 further includes a color filter layer 05, and the color filter layer 05 is arranged at a side of the light-emitting element layer 02 facing away from the substrate 01. The color filter layer 05 includes a black matrix 51, a primary color resist 52, and an auxiliary color resist 53. The primary color resist 52 and the auxiliary color resist 53 fill the openings in the black matrix 51.

As shown in FIG. 40 and FIG. 41, the light-shielding part 31 of the light-shielding layer 03 is reused as the black matrix 51, the first opening 32 is filled with the primary color resist 52, and the second opening 33 is filled with the auxiliary color resist 53. That is, in the direction perpendicular to the plane of the display panel 001, the primary color resist 52 overlaps with the first opening 32 and the auxiliary color resist 53 overlaps with the second opening 33.

It should be noted that for the primary light-emitting element 21 and the primary color resist 52 that overlap with a same first opening 32, the color of the light emitted by the primary light-emitting element 21 is the same as the color of the primary color resist 52; and the color of the auxiliary color resist 53 in the second opening 33 is the same as the color of the light emitted by the auxiliary light-emitting element 22 corresponding to the second opening 33.

In one embodiment, as shown in FIG. 40, a thickness of the primary color resist 52 is greater than a thickness of the auxiliary color resist 53 at the periphery of the primary color resist 52. That is, the primary color resist 52 that is mainly configured to transmit the display light emitted by the primary light-emitting element 21 is thicker, and the auxiliary color resist 53 that is mainly configured to transmit the interfering light emitted by the auxiliary light-emitting element 22 is thinner. Since the area of the first opening 32 is usually greater than the area of the second opening 33, the greater thickness of the primary color resist 52 in the first opening 32 can effectively reduce the reflection of the external light by the display panel 001.

In one embodiment, as shown in FIG. 41, a thickness of the primary color resist 52 is smaller than a thickness of the auxiliary color resist 53 at the periphery of the primary color resist 52. That is, the primary color resist 52 that is mainly configured to transmit the display light emitted by the primary light-emitting element 21 is thinner, and the auxiliary color resist 53 that is mainly configured to transmit the interfering light emitted by the auxiliary light-emitting element 22 is thicker. Since the thickness of the primary color resist 52 above the primary light-emitting element 21 is small, it can ensure that the display panel 001 has high display brightness. By setting the thickness of the auxiliary color resist 53 in the second opening 33 to be large, a problem of increased reflectivity of the display panel 001 to the external light due to the provision of the second opening 33 can be alleviated as much as possible.

In addition, when the thickness of the auxiliary color resist 53 corresponding to the auxiliary light-emitting element 22 is increased, even if the brightness of the auxiliary light-emitting element 22 is increased for increasing the brightness of the interfering light, the increasing in driving power consumption of the pixel circuit that is electrically connected to the auxiliary light-emitting element 22 does not affect the power consumption of the display panel 001 too much.

Figure 42:
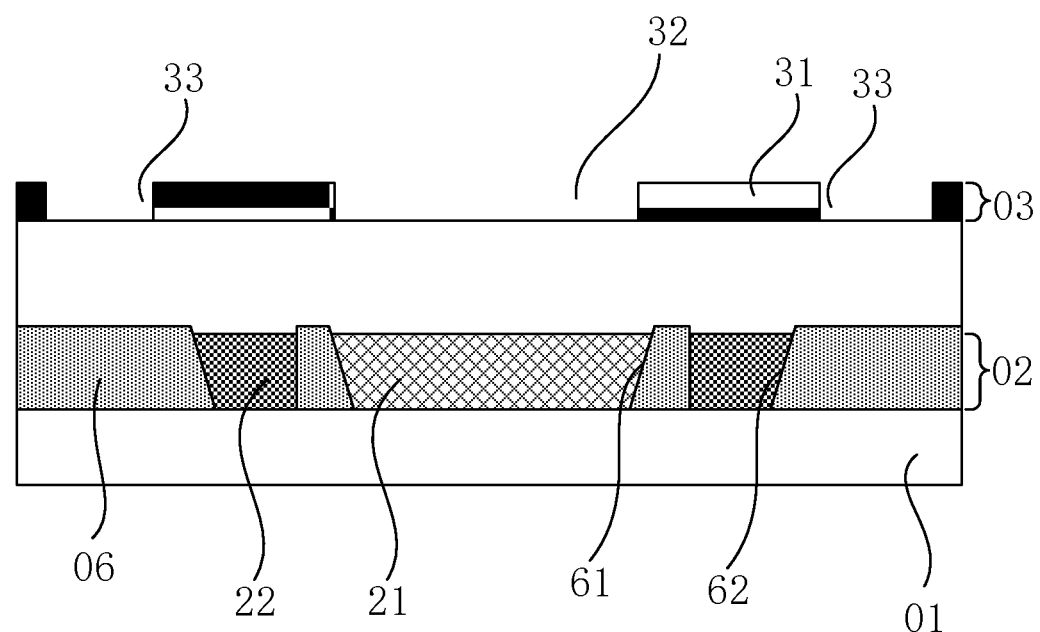
FIG. 42 is a schematic diagram showing a light-emitting element and a color filter layer according to an embodiment of the present disclosure.

FIG. 42 is a schematic diagram showing a light-emitting element and a color filter layer according to an embodiment of the present disclosure.

In one embodiment, as shown in FIG. 42, the display panel 001 further includes a pixel define layer 06, and the pixel define layer 06 includes a primary opening 61 and an auxiliary opening 62. The primary light-emitting element 21 is arranged in the primary opening 61, and the primary opening 61 defines a light-exiting area of the primary light-emitting element 21. The auxiliary light-emitting element 22 is arranged in the auxiliary opening 62, and the auxiliary opening 62 defines a light-exiting area of the auxiliary light-emitting element 22.

The auxiliary opening 62 has a first side wall close to the primary opening 61 and a second side wall away from the primary opening 61, and an inclined angle of the first sidewall is greater than an inclined angel of the second sidewall. That is, the side wall of the auxiliary opening 62 away from the first opening 32 is gentler, and the side wall of the auxiliary opening 62 close to the first opening 32 is steeper. In this case, the light-exiting amount of the light that is emitted by the auxiliary light-emitting element 22 in the auxiliary opening 62 and transmitted to the first opening 32 is reduced, and the light-exiting amount of the light that is emitted by the auxiliary light-emitting element 22 in the auxiliary opening 62 and transmitted to the second opening 33 is increased.

In one embodiment of the present disclosure, the light emitted by the primary light-emitting element 21 and the light emitted by the auxiliary light-emitting element 22 adjacent to the primary light-emitting element 21 are of a same color. That is, the display light emitted by the primary light-emitting element 21 and the interfering light emitted by the auxiliary light-emitting element 22 adjacent to the primary light-emitting element 21 are of a same color. In this embodiment, the interfering light emitted by the auxiliary light-emitting element 22 can exit by traveling through the primary color resist 52 in the first opening 32 and the auxiliary color resist 53 in the second opening 33, thereby ensuring the interfering effect of the auxiliary light-emitting element 22.

The structure of the primary light-emitting element 21 and the structure of the auxiliary light-emitting element 22 in this embodiment may be as shown in FIG. 15 or as shown in FIG. 16, which will not be repeated herein. It should be noted that, when the primary light-emitting element 21 and the auxiliary light-emitting element 22 in this embodiment are both organic light-emitting diodes, the expression that the primary light-emitting element 21 is arranged in the primary opening 61 means that the organic light-emitting layer 213 of the primary light-emitting element 21 is arranged in the primary opening 61, and the expression that the auxiliary light-emitting element 22 is arranged in the auxiliary opening 62 means that the organic light-emitting layer 223 of the auxiliary light-emitting element 22 is arranged in the auxiliary opening 62.

In order to realize the interfering to the display image of the display panel 001 at a large viewing angle, the interfering image displayed by the plurality of auxiliary light-emitting elements 22 needs to be different from the display image.

In addition, in order to further enhance the interfering effect of the auxiliary light-emitting element 22, the brightness of the light emitted by the auxiliary light-emitting element 22 may be greater than the brightness of the light emitted by the primary light-emitting element 21. In order to realize that the brightness of the auxiliary light-emitting element 22 is greater than the brightness of the primary light-emitting element 21, the auxiliary light-emitting element 22, the primary light-emitting element 21 and the pixel circuit may be connected in the manner provided in the embodiment corresponding to FIG. 9. That is, the first pixel circuit 41 is electrically connected to the primary light-emitting element 21, and the second pixel circuit 42 is electrically connected to the auxiliary light-emitting element 22.

In one embodiment, the color of the light emitted by the primary light-emitting element 21 is different from the color of the light emitted by the auxiliary light-emitting element 22 that is adjacent to the primary light-emitting element 21 and located at the periphery of the primary light-emitting element 21. That is, the color of the display light emitted by the primary light-emitting element 21 is different from the color of the interfering light emitted by the auxiliary light-emitting element 22 at the periphery of the primary light-emitting element 21. In this case, when the display panel 001 is in the anti-peering mode, the viewer at a large viewing angle can see the light emitted by the primary light-emitting element 21 as well as the light emitted by the auxiliary light-emitting element 22 having a different color. In this embodiment, the anti-peering is realized by exiting light of messy colors at a large viewing angle.

Since the color of the light emitted by the primary light-emitting element 21 is different from the color of the light emitted by the auxiliary light-emitting element 22 that is adjacent to the primary light-emitting element 21 and located at the periphery of the primary light-emitting element 21, when the display panel is viewed at a large viewing angle, the display image displayed by the plurality of primary light-emitting elements 21 is different from the interfering image displayed by the plurality of auxiliary light-emitting elements 22.

Since the color of the light emitted by the primary light-emitting element 21 is different from the color of the light emitted by the auxiliary light-emitting element 22 that is adjacent to the primary light-emitting element 21 and located at the periphery of the primary light-emitting element 21, the structure of the primary light-emitting element 21 and the structure of the auxiliary light-emitting element 22 in this embodiment may be implemented as that shown in FIG. 16, which is not repeated herein.

In addition, in order to further enhance the interfering effect of the auxiliary light-emitting element 22, the brightness of the light emitted by the auxiliary light-emitting element 22 may be greater than the brightness of the light emitted by the primary light-emitting element 21.

It should be noted that, since the color of the light emitted by the primary light-emitting element 21 is different from the color of the light emitted by the auxiliary light-emitting element 22 that is adjacent to the primary light-emitting element 21 and located at the periphery of the primary light-emitting element 21, the color of the primary color resist 52 is different from the color of the secondary color resist 53 that is adjacent to the primary color resist 52 and located at the periphery of the primary color resist 52, and the light emitted by the auxiliary light-emitting element 22 cannot exit by traveling through the primary color resist 52 above the primary light-emitting element 21 adjacent to the auxiliary light-emitting element 22. In this embodiment, the inclined angle of the side wall of the auxiliary opening 62 in the pixel define layer 06 can be adjusted as shown in FIG. 42, to increase the light-exiting amount of the light that is emitted by the auxiliary light-emitting element 22 towards the first opening 32.

In addition, in order to further enhance the interfering effect of the auxiliary light-emitting element 22, the brightness of the light emitted by the auxiliary light-emitting element 22 may be greater than the brightness of the light emitted by the primary light-emitting element 21. In order to realize that the brightness of the auxiliary light-emitting element 22 is greater than the brightness of the primary light-emitting element 21, the auxiliary light-emitting element 22, the primary light-emitting element 21 and the pixel circuit may be connected in the manner provided in the embodiment corresponding to FIG. 9. That is, the first pixel circuit 41 is electrically connected to the primary light-emitting element 21, and the second pixel circuit 42 is electrically connected to the auxiliary light-emitting element 22.

In such embodiments, in order to achieve the anti-peering effect by using the light of messy colors that is emitted by the auxiliary light-emitting element 22 at a large viewing angle, the primary light-emitting element 21 may share the pixel circuit 40 with the auxiliary light-emitting element 22 at the periphery of the primary light-emitting element 21. The primary light-emitting element 21, the auxiliary light-emitting element 22, and the pixel circuit 40 may be connected in the manner provided in the embodiments corresponding to FIG. 9 and FIG. 14, which is not be repeated herein.

Figure 43:
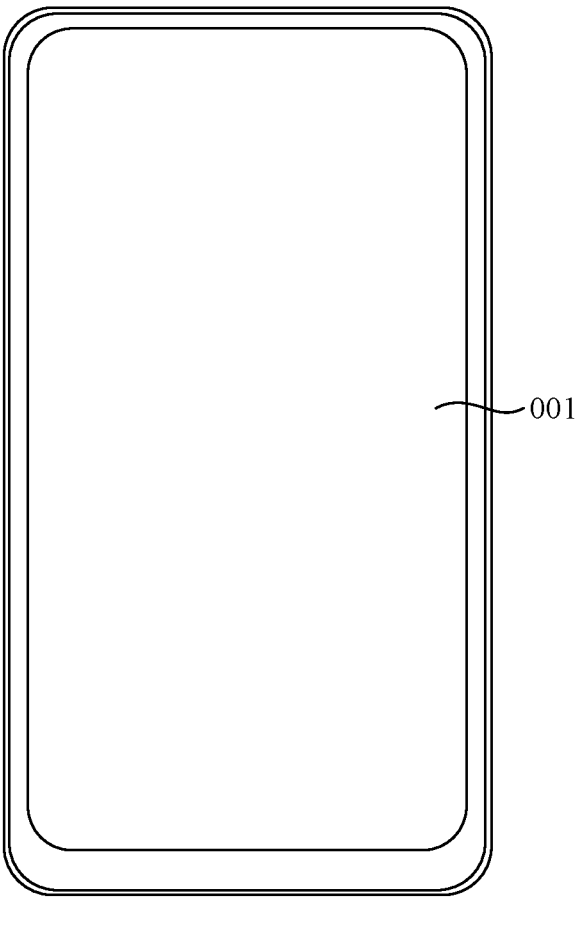
FIG. 43 is a schematic diagram showing a display device according to an embodiment of the present disclosure.

FIG. 43 is a schematic diagram showing a display device according to an embodiment of the present disclosure.

As shown in FIG. 43, a display device is further provided in an embodiment of the present disclosure, and the display device includes the display panel 001 according to any of the above embodiments. The structure of the display panel 100 has been described in the above embodiments, which will not be repeated herein. It should be noted that the display device shown in FIG. 43 is merely for exemplary illustration, and the display device may be any device with a display function, such as a mobile phone, a tablet computer, a notebook computer, a television or the like.

In the display device provided by the embodiments of the present disclosure, when both the primary light-emitting element 21 and the auxiliary light-emitting element 22 emit light, the viewer at a large viewing angle not only sees light emitted by the primary light-emitting element 21 but also sees interfering light emitted by the auxiliary light-emitting element 22. As a result, the display device provided by embodiments of the present disclosure can achieve the anti-peering effect, thereby well protecting the privacy of the users. When the primary light-emitting element 21 emits light and the auxiliary light-emitting element 22 does not emit light, whether at a large viewing angle or a small viewing angle, the viewer can only see the light emitted by the primary light-emitting element 21, that is, the viewer can normally see the image displayed by the display panel at different viewing angles. Therefore, switching between different display modes is realized in the display device provided by the embodiments of the present disclosure, and the controlling of the display mode of the display panel is more flexible, thereby improving the user experience.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, comprising:
a substrate;
a light-emitting element layer arranged at a side of the substrate and comprising primary light-emitting elements and auxiliary light-emitting elements, wherein at least one of the auxiliary light-emitting elements is arranged at a periphery of a respective one of the primary light-emitting elements; and
a light-shielding layer arranged at a side of the light-emitting element layer facing away from the substrate, wherein the light-shielding layer comprises a light-shielding part and first openings corresponding to the primary light-emitting elements, and the light-shielding part covers the auxiliary light-emitting elements,
wherein a display mode of the display panel comprises a normal mode and an anti-peeping mode; and
wherein in the normal mode, the primary light-emitting elements emit light, and the auxiliary light-emitting elements are off; and in the anti-peeping mode, the primary light-emitting elements emit light, and the auxiliary light-emitting elements emit light.

2. The display panel according to claim 1, wherein in the anti-peeping mode, a brightness of the auxiliary light-emitting elements is greater than a brightness of the primary light-emitting elements.

3. The display panel according to claim 1, wherein at least one of the auxiliary light-emitting elements surrounds the respective one of the primary light-emitting elements, or at least two of the auxiliary light-emitting elements are arranged at a periphery of the respective one of the primary light-emitting elements.

4. The display panel according to claim 1, wherein at least two of the auxiliary light-emitting elements are arranged at two opposite sides of the respective one of the primary light-emitting elements.

5. The display panel according to claim 4, wherein at least two of the auxiliary light-emitting elements are arranged at the periphery of the respective one of the primary light-emitting elements, and the at least two auxiliary light-emitting elements have different distances to the respective one of the primary light-emitting elements.

6. The display panel according to claim 1, wherein an edge of one of the primary light-emitting elements close to one of the auxiliary light-emitting elements has a first convex-concave structure, and an edge of the one of the auxiliary light-emitting elements close to the one of the primary light-emitting elements has a second convex-concave structure; and wherein a concave part of the first convex-concave structure surrounds a convex part of the second convex-concave structure, and a concave part of the second convex-concave structure surrounds a convex part of the first convex-concave structure.

7. The display panel according to claim 1, wherein the primary light-emitting elements comprise a first primary light-emitting element and a second primary light-emitting element, and an area of the second primary light-emitting element is greater than an area of the first primary light-emitting element; and wherein an area of one of the auxiliary light-emitting elements at the periphery of the second primary light-emitting element is greater than an area of one of the auxiliary light-emitting elements at the periphery of the first primary light-emitting element.

8. The display panel according to claim 1, wherein the primary light-emitting elements comprise a first primary light-emitting element and a second primary light-emitting element, a width of the first primary light-emitting element in a first direction is a1, and a width of the second primary light-emitting element in the first direction is b1; and wherein in the first direction, a width of one of the auxiliary light-emitting elements at the periphery of the first primary light-emitting element is a2, and a width of one of the auxiliary light-emitting elements at the periphery of the second primary light-emitting element is b2, where a1<a2, and (a2/a1)> (b2/b1).

9. The display panel according to claim 1, wherein in a direction perpendicular to a plane of the display panel, a projection of one auxiliary light-emitting element of the auxiliary light-emitting elements at the periphery of one of the primary light-emitting elements has an edge close to a projection of one first opening of the first openings corresponding to the one of the primary light-emitting elements, and a minimum distance between the edge of the projection of the one auxiliary light-emitting element and an edge of the projection of the one first opening is x, where x>0.

10. The display panel according to claim 9, wherein x satisfies:

$$x > \frac{h * n_1 \sin\theta_1}{\sqrt{n_2^2 - n_1^2 * \sin\theta_1}}$$

where h denotes a minimum distance between the one auxiliary light-emitting element and the light-shielding layer, $n_1$ denotes a refractivity of a layer at a side of the light-shielding layer facing away from the light-emitting element layer, $n_2$ denotes a refractivity of a layer between the light-shielding layer and the light-emitting element layer, and $\theta_1$ denotes a minimum anti-peeping angle of the display panel.

11. The display panel according to claim 1, further comprising a light filter layer arranged at a side of the light-emitting element layer facing away from the substrate, wherein the light filter layer comprises a black matrix and a primary color resist, the light-shielding part is reused as the black matrix, and at least one of the first opening is filled with the primary color resist.

12. The display panel according to claim 11, wherein a thickness of a part of the primary color resist close to one of the auxiliary light-emitting elements is smaller than a thickness of a center part of the primary color resist.

13. The display panel according to claim 1, wherein the light-shielding part between adjacent first openings of the first openings is a continuous structure.

14. The display panel according to claim 13, wherein the primary light-emitting elements are exposed by the first openings.

15. The display panel according to claim 14, wherein in a direction perpendicular to a plane of the display panel, an area of a projection of one primary light-emitting element of the primary light-emitting elements is greater than an area of a projection of one first opening of the first openings corresponding to the one primary light-emitting element.

16. The display panel according to claim 13, wherein light emitted by one primary light-emitting element of the primary light-emitting elements and light emitted by one auxiliary light-emitting element of the auxiliary light-emitting elements at the periphery of the one primary light-emitting element are of a same color.

17. The display panel according to claim 1, wherein the light-shielding layer further comprises second openings, and one of the second openings is at a periphery of a respective one of the first openings.

18. The display panel according to claim 17, wherein in a direction perpendicular to a plane of the display panel, a projection of one of the second openings is located at a side of a projection of one of the auxiliary light-emitting elements facing away from one of the primary light-emitting elements.

19. The display panel according to claim 18, wherein in the direction perpendicular to the plane of the display panel, a minimum distance between an edge of the projection of one of the auxiliary light-emitting elements close to the projection of one of the second openings corresponding to the one of the auxiliary light-emitting elements and an edge of the projection of the one of the second openings close to the projection of the one of the auxiliary light-emitting elements is y, and y satisfies:

$$y > \frac{h * n_1 * \sin\theta_1}{\sqrt{n_2^2 - n_1^2 * \sin\theta_1}}$$

where h denotes a minimum distance between the one of the auxiliary light-emitting elements and the light-shielding layer, $n_1$ denotes a refractivity of a layer at a side of the light-shielding layer facing away from the light-emitting element layer, $n_2$ denotes a refractivity of a layer between the light-shielding layer and the light-emitting element layer, and $\theta_1$ denotes a minimum anti-peeping angle of the display panel.

20. The display panel according to claim 17, wherein one of the auxiliary light-emitting elements surrounds a respective one of the primary light-emitting elements, and one of the second openings surrounds a respective one of the first openings.

21. The display panel according to claim 17, wherein in a direction perpendicular to a plane of the display panel, an area of a projection of one of the first openings is smaller than or equal to an area of a projection of one of the primary light-emitting elements.

22. The display panel according to claim 17, wherein at least one edge of one second opening of the second openings comprises a third convex-concave structure.

23. The display panel according to claim 22, wherein an edge of one auxiliary light-emitting element of the auxiliary light-emitting elements facing one of the second openings is a smooth structure.

24. The display panel according to claim 17, further comprising a pixel define layer,
   wherein the pixel define layer comprises primary openings and auxiliary openings, the primary light-emitting elements are arranged in the primary openings, and the auxiliary light-emitting elements are arranged in the auxiliary openings; and
   wherein at least one of the auxiliary openings has a first side wall close to one of the primary openings and a second side wall away from the one of the primary openings, and an inclined angle of the first sidewall is greater than an inclined angel of the second sidewall.

25. The display panel according to claim 17, further comprising a light filter layer that comprises primary color resists and auxiliary color resists,
   wherein in a direction perpendicular to a plane of the display panel, one of the primary color resists overlaps with one of the first openings, and one of the auxiliary color resists overlaps with one of the second openings; and
   wherein a thickness of one of the primary color resists is greater than a thickness of one of the auxiliary color resists at a periphery of the one of the primary color resists.

26. The display panel according to claim 17, further comprising a color filter layer that comprises primary color resists and auxiliary color resists,
   wherein in a direction perpendicular to a plane of the display panel, one of the primary color resists overlaps with one of the first openings, and one of the auxiliary color resists overlaps with one of the second openings; and
   wherein a thickness of one of the primary color resists is smaller than a thickness of one of the auxiliary color resists at a periphery of the one of the primary color resists.

27. The display panel according to claim 17, wherein light emitted by one of the primary light-emitting elements and light emitted by one of the auxiliary light-emitting elements that is at a periphery of the one of the primary light-emitting elements are of a same color.

28. The display panel according to claim 17, wherein light emitted by one of the primary light-emitting elements and light emitted by one of the auxiliary light-emitting elements that is at a periphery of the one of the primary light-emitting elements are of different colors.

29. The display panel according to claim 28, further comprising a pixel circuit array layer that comprises pixel circuits and a mode controlling module,
   wherein the mode controlling module is configured to control a light-emitting state of the auxiliary light-emitting elements according to a display mode of the display panel;
   wherein the pixel circuits are electrically connected to the primary light-emitting elements; and
   wherein the pixel circuits are electrically connected to the auxiliary light-emitting elements through the mode controlling module.

30. The display panel according to claim 28, further comprising a pixel circuit array layer that comprises pixel circuits and a mode controlling module,
   wherein the mode controlling module is configured to control a light-emitting state of the auxiliary light-emitting elements according to a display mode of the display panel; and
   wherein one of the pixel circuits comprises a light-emitting driving transistor, a light-emitting controlling transistor, and an auxiliary light-emitting controlling transistor; and
   wherein the light-emitting controlling transistor is electrically connected between the light-emitting driving transistor and the primary light-emitting element, and the auxiliary light-emitting controlling transistor is electrically connected between the light-emitting driving transistor and the auxiliary light-emitting element.

31. The display panel according to claim 27, further comprising a pixel circuit array layer,
   wherein the pixel circuit array layer comprises pixel circuits, and at least one of the pixel circuits comprises a first pixel circuit and a second pixel circuit; and
   wherein the first pixel circuit is electrically connected to one of the primary light-emitting elements, and the second pixel circuit is electrically connected to one of the auxiliary light-emitting elements.

32. A display device comprising a display panel, wherein the display panel comprises:
   a substrate;
   a light-emitting element layer arranged at a side of the substrate and comprising primary light-emitting elements and auxiliary light-emitting elements, wherein at least one of the auxiliary light-emitting elements is arranged at a periphery of a respective one of the primary light-emitting elements; and
   a light-shielding layer arranged at a side of the light-emitting element layer facing away from the substrate, wherein the light-shielding layer comprises a light-shielding part and first openings corresponding to the primary light-emitting elements, and the light-shielding part covers the auxiliary light-emitting elements,
   wherein a display mode of the display panel comprises a normal mode and an anti-peeping mode; and
   wherein in the normal mode, the primary light-emitting elements emit light, and the auxiliary light-emitting elements are off; and in the anti-peeping mode, the primary light-emitting elements emit light, and the auxiliary light-emitting elements emit light.

33. A display panel, comprising:
   a substrate;

a light-emitting element layer arranged at a side of the substrate and comprising primary light-emitting elements and auxiliary light-emitting elements, wherein at least one of the auxiliary light-emitting elements is arranged at a periphery of a respective one of the primary light-emitting elements; and a light-shielding layer arranged at a side of the light-emitting element layer facing away from the substrate, wherein the light-shielding layer comprises a light-shielding part and first openings corresponding to the primary light-emitting elements, and the light-shielding part covers the auxiliary light-emitting elements, wherein an edge of one of the primary light-emitting elements close to one of the auxiliary light-emitting elements has a first convex-concave structure, and an edge of the one of the auxiliary light-emitting elements close to the one of the primary light-emitting elements has a second convex-concave structure matching the first convex-concave structure.

34. A display panel, comprising:

a substrate;

a light-emitting element layer arranged at a side of the substrate and comprising primary light-emitting elements and auxiliary light-emitting elements, wherein at least one of the auxiliary light-emitting elements is arranged at a periphery of a respective one of the primary light-emitting elements; and a light-shielding layer arranged at a side of the light-emitting element layer facing away from the substrate, wherein the light-shielding layer comprises a light-shielding part and first openings corresponding to the primary light-emitting elements, and the light-shielding part covers the auxiliary light-emitting elements, wherein the display panel further comprises a light filter layer arranged at a side of the light-emitting element layer facing away from the substrate, the light filter layer comprises a black matrix and a primary color resist, the light-shielding part is reused as the black matrix, and at least one of the first opening is filled with the primary color resist.

* * * * *